US007371287B2

(12) United States Patent

Shaver et al.

(10) Patent No.: US 7,371,287 B2

(45) Date of Patent: May 13, 2008

(54) SUBSTRATE HANDLING SYSTEM

(75) Inventors: Norman L. Shaver, Tucson, AZ (US); Timothy A. Ellis, Tucson, AZ (US); David R. Hill, Oro Valley, AZ (US)

(73) Assignee: PerkinElmer, Inc., Wellesley, MA (US)

( * ) Notice: Subject to any disclaimer, the term of this patent is extended or adjusted under 35 U.S.C. 154(b) by 322 days.

(21) Appl. No.: 10/837,842

(22) Filed: May 3, 2004

(65) Prior Publication Data

US 2005/0000454 A1 Jan. 6, 2005

Related U.S. Application Data

(60) Provisional application No. 60/474,185, filed on May 29, 2003.

(51) Int. Cl.
*C23C 16/00* (2006.01)
*C23F 1/00* (2006.01)
*H01L 21/306* (2006.01)

(52) U.S. Cl. .................. 118/729; 118/728; 156/345.54; 414/941

(58) Field of Classification Search ................ 118/729; 355/53
See application file for complete search history.

(56) References Cited

U.S. PATENT DOCUMENTS

| | | | | |
|---|---|---|---|---|
| 5,495,279 | A * | 2/1996 | Sandstrom | 347/258 |
| 6,285,102 | B1 * | 9/2001 | Matsuoka et al. | 310/90 |
| 6,351,041 | B1 * | 2/2002 | Okubo | 310/12 |
| 6,842,221 | B1 * | 1/2005 | Shiraishi | 355/30 |
| 2003/0169524 | A1 * | 9/2003 | Adin et al. | 359/896 |
| 2003/0183611 | A1 * | 10/2003 | Gregor et al. | 219/390 |

FOREIGN PATENT DOCUMENTS

JP 06306559 A * 11/1994

* cited by examiner

*Primary Examiner*—Ram N Kackar
*Assistant Examiner*—Rakesh K Dhingra
(74) *Attorney, Agent, or Firm*—Carmody & Torrance LLP

(57) ABSTRACT

A substrate handling system and method in which an air chuck produces a film of air between the substrate and the air chuck, a magnetic chuck attracts the substrate to the air chuck, and an actuator subsystem moves the magnetic chuck closer to and away from the air chuck to alternately pick up a substrate and release the substrate.

27 Claims, 26 Drawing Sheets

SUBSTRATE HANDLING SYSTEM

RELATED APPLICATIONS

This application claims priority from Provisional application Ser. No. 60/474,185 filed on May 29, 2003.

FIELD OF THE INVENTION

This invention relates to a substrate handling system for moving substrates such as flexographic printing plates between different modules of a computer-to-plate machine but is also useful in connection with handling other types of substrates and items.

BACKGROUND OF THE INVENTION

In a variety of fields, there is a need to maneuver substrates from one location to another. For example, in an automatic computer-to-plate (CTP) exposure machine, unexposed printing plates are robotically maneuvered from an in-feed module to an imaging module to be imaged and, after imaging, maneuvered to an out-feed section.

When the plates are offset plates, suction cups can be used as components of the handling system to move the plates from one location to another.

Flexographic printing plates have gained favor in the industry because of their superior durability and the environmentally friendly nature of the plate processing and the ink used on the printed media. Due to the presence of a delicate photopolymer resin layer on the top surface of flexographic printing plates, however, handling these types of printing plates can be a concern. Standard suction cup type handling systems would mar the photopolymer resin layer.

U.S. Pat. No. 6,425,565, hereby incorporated herein by this reference, discloses a suction cup covered by an apertured flexible sheet in an attempt to provide a conformal barrier which prevents direct physical contact between the plate and the contact flange of the suction cup. Still, due to the contact between the plate and the suction cup, the possibility for scratching, marring, or damage still exists.

Also, flexographic printing plates stacked together are separated from each other by a paper interleaf or slip sheet which must be removed before imaging. Thus, there is a need to not only carefully handle the flexographic printing plates but also the requirement that the slip sheet between any two plates be removed by the handling system before imaging.

The removal of slip sheets from flexographic plates is more complicated than conventional offset plates due to the tacky nature of the soft photopolymer coating. The flexographic photopolymer can be very soft and tends to cold flow causing the slip sheet to adhere strongly across the surface of the plate especially near the edges. This increased adhesion sometimes prevents the slip sheets from being removed solely by the more common simple removal methods such as an airjet blow off system. So, there is a need for a mechanism to reliably separate the slip sheet from the flexographic plate.

SUMMARY OF THE INVENTION

It is therefore an object of this invention to provide a better handling system for delicate substrates including, but not limited to, flexographic printing plates.

It is a further object of the subject invention to provide such a system in which there is no contact at all between the substrate and the handling system.

It is a further object of this invention to provide such a system which prevents damage, scratching, or marring of the substrates as they are maneuvered and repositioned.

It is a further object of this invention to provide such a system which insures positive handling of the substrates.

It is a further object of this invention to provide such a system which, to the maximum extent possible, is compatible with existing robotic handling systems.

It is a further object of this invention to provide such a system which does not require that the substrates be turned over or rotated prior to, during, or subsequent to handling.

It is a further object of this invention to provide a system which better facilitates the separation of slip sheets from the very sticky surfaces of flexo plates.

This invention results from the realization that items such as flexographic printing plates which often include ferromagnetic material in the form of a steel substrate coated with a soft, delicate photosensitive resin can not be directly handled without marring the delicate photosensitive resin but can be protectively maneuvered by the use of magnetic attraction via a magnetic array in combination with an air chuck which provides a layer of air between the plate and the handling system so that the delicate photosensitive resin layer never contacts any component of the handling system.

This invention features a substrate handling system comprising a gas chuck for producing a film of gas between the substrate and the gas chuck and a magnetic chuck configured to alternately attract the substrate to the film of gas and to release the substrate thereby preventing marring of the substrate.

In one embodiment, the gas chuck is mounted to the magnetic chuck and the magnetic chuck is movable closer to the gas chuck to attract the substrate and in which the magnetic chuck is movable away from the gas chuck to release the substrate.

Typically, an actuator subsystem moves the magnetic chuck away from and closer to the gas chuck. In one example, the actuator subsystem includes at least one gas cylinder attached to the magnetic chuck and having a piston contacting the gas chuck for moving the magnetic chuck away from the gas chuck. A spring biases the magnetic chuck closer to the gas chuck.

In one specific example, the gas chuck includes a first large area plate within array of gas orifices therein and the magnetic chuck includes a second large area plate with an array of magnets attached thereto. There may be a robot interface mount attached to the first large area plate for maneuvering the handling system to transfer the substrate from a feed station to an imaging station. For a CTP machine, there may be two or more side-by-side handling systems for transferring two or more smaller substrates at a time or one large substrate from the feed station to the imaging station.

In another specific example, a gas chuck is attached to the mounting plate and a magnetic chuck is attached to the mounting plate in a movable fashion closer to and away from the gas chuck. There may be a gimbal assembly between the gas chuck and the mounting plate. In one embodiment, the gas chuck includes the small area plate with the plurality of orifices therein, and the magnetic chuck includes a permanent magnet. An actuator subsystem moves the permanent magnet closer to and away from the gas chuck. One actuator subsystem includes a gas cylinder connected to the mounting plate and a piston interconnected to the permanent magnet for urging the permanent magnet alternately closer to and away from the substrate.

For one particular CTP machine, there are a plurality of gas chucks in a line attached to the mounting plate and a plurality of corresponding permanent magnets each connected via a bar to a cross member driven by the actuator subsystem. A robotic arm is connected to the mounting plate for translating the mounting plate and there is an actuator between the robotic arm and the mounting plate for raising and lowering the mounting plate.

The subject invention may further include a slip sheet removal subsystem for separating a slip sheet from the substrate. Typically, the slip sheep removal subsystem includes at least one magnet for attracting the substrate as the slip sheet is removed. The slip sheet removal subsystem preferably includes at least one tape mechanism including a feed roll, a take up roll, and a foot over which tape from the feed roll passes before being wound on the take up roll.

One substrate handling system in accordance with this invention features an air chuck for producing a film of air between the substrate and the air chuck, a magnetic chuck for attracting the substrate to the air chuck, and an actuator subsystem for moving the magnetic chuck closer to and away from the air chuck to alternately pick up a substrate and release the substrate.

In one example, a first large area plate has an array of gas orifices therein for producing a film of air between the substrate and plate, a second large area plate has an array of permanent magnets attached thereto and is moveably mounted with respect to the first large area plate. An actuator subsystem moves the second large area plate closer to and away from the first large area plate to alternately pick up and release the substrate.

In another example, an air chuck is attached to a mounting plate for producing a film of air between the substrate and the air chuck. A magnetic chuck is attached to the mounting plate in a movable fashion closer to and away from the air chuck. An actuator subsystem moves the magnetic chuck closer to and away from the air chuck for alternately picking up and releasing the substrate. For one CTP machine, the air chuck includes a plurality of discrete members with air orifices therein and the magnetic chuck includes a plurality of corresponding permanent magnets. The permanent magnets are each connected via a bar to a cross member which is raised and lowered with respect to the mounting plate by the actuator subsystem.

An exemplary substrate handling system in accordance with this invention features a first large area plate with an array of gas orifices therein for producing a film of air between the substrate and the plate, a second large area plate with an array of magnets and moveably mounted with respect to the first large area plate, an actuator subsystem for moving the second large area plate closer to and away from the first large area plate to alternately pick up and release the substrate, and a slip sheet removal subsystem including at least one tape mechanism for attracting a slip sheet, and at least one nozzle for removing the slip sheet. A typical tape mechanism includes a feed roll, a take up roll, and a foot over which the tape from the feed roll passes before being wound on the take up roll.

This invention also features a method of handling substrates subject to marring, the method comprising magnetically attracting a substrate to an air chuck to overcome the force of gravity on the substrate, actuating the air chuck to provide a film of air between the substrate and the air chuck, and removing the magnetic force to release the substrate. The method may further include the step of removing a slip sheet from the substrate by adhering the slip sheet to a tape mechanism pulling the slip sheet off the plate with the tape, and then blowing the slip sheet off the plate.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
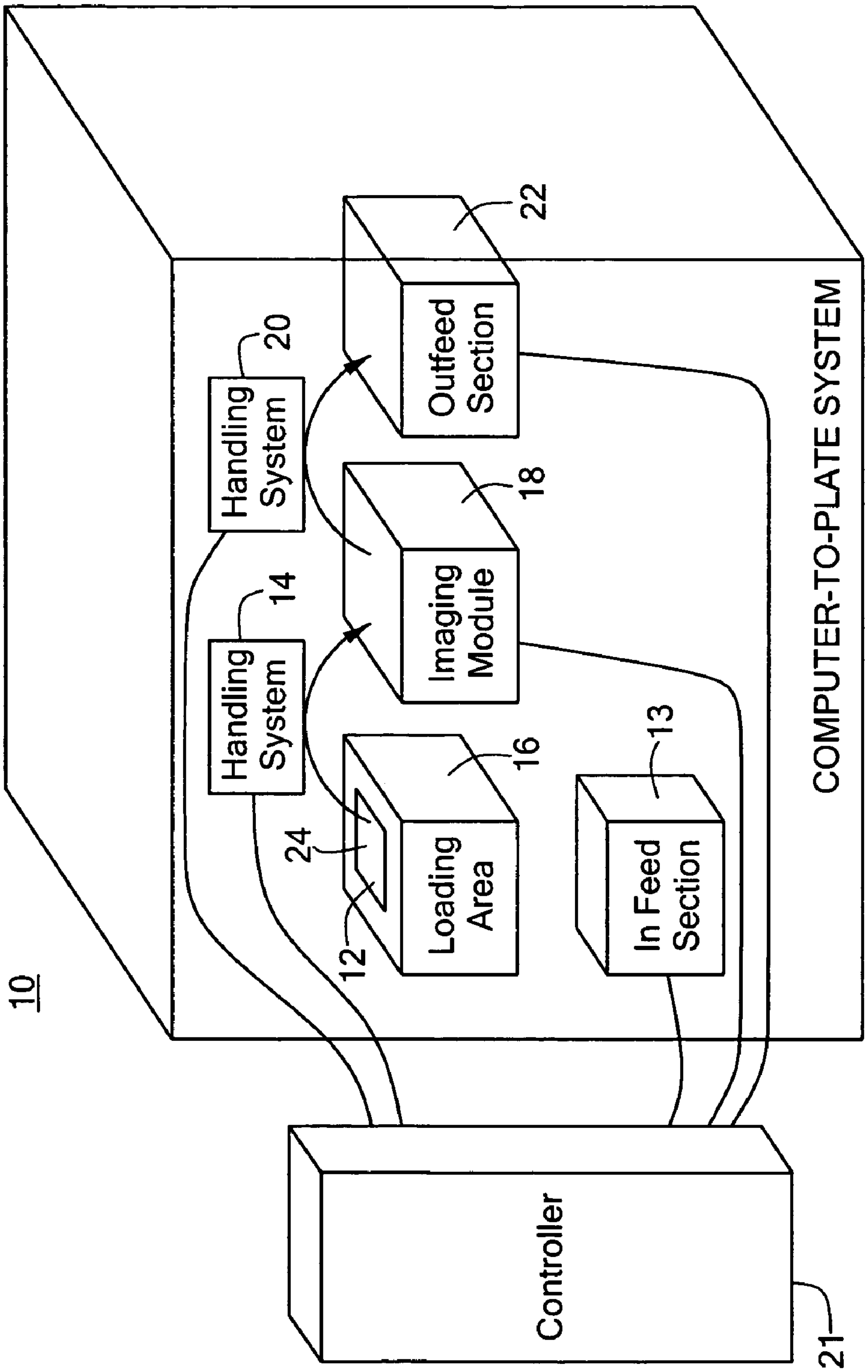
FIG. 1 is a schematic three-dimensional view showing several of the primary components of a typical computer-to-plate machine and the location of two handling systems in accordance with the preferred embodiment of the subject invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

As discussed in the background section above, computer-to-plate (CTP) machine 10, FIG. 1 is an example of one system in which printing plates 12 are transferred by handling system 14 from loading area 16 to imaging module 18 for imaging. Thereafter, the substrates are transferred from imaging module 18 by handling system 20 to out-feed section 22. In one example, two printing plates at the time are transferred, imaged, and then offloaded.

In the prior art, robotically controlled suction cup type handling systems served as handling systems 14 and 20 under the control of controller 21. With flexographic printing plates 12 which bear a delicate photopolymer resin layer on top surface 24, however, conventional suction cup type handling systems cannot be used since the result would be marring, scratching, or damage to top surface layer 24. U.S. Pat. No. 6,425,565 proposes, as also delineated in the background section above, a conformal flexible sheet between the suction cup and the delicate top surface 24 of substrate 12. But still, there is a danger of marring, scratching, or damage of top surface 24 because of highly concentrated forces over small contact areas.

The idea behind the present invention is that the substrate or at least the delicate top surface thereof never comes into contact with any portion of the handling system. And yet, positive, accurate control of the substrate is attained. The following examples relate to flexographic printing plates on steel substrates and a particular CTP machine but the subject invention has applicability in other industries and in any environment where substrates or items need to be maneuvered from one location to another.

Figure 2:
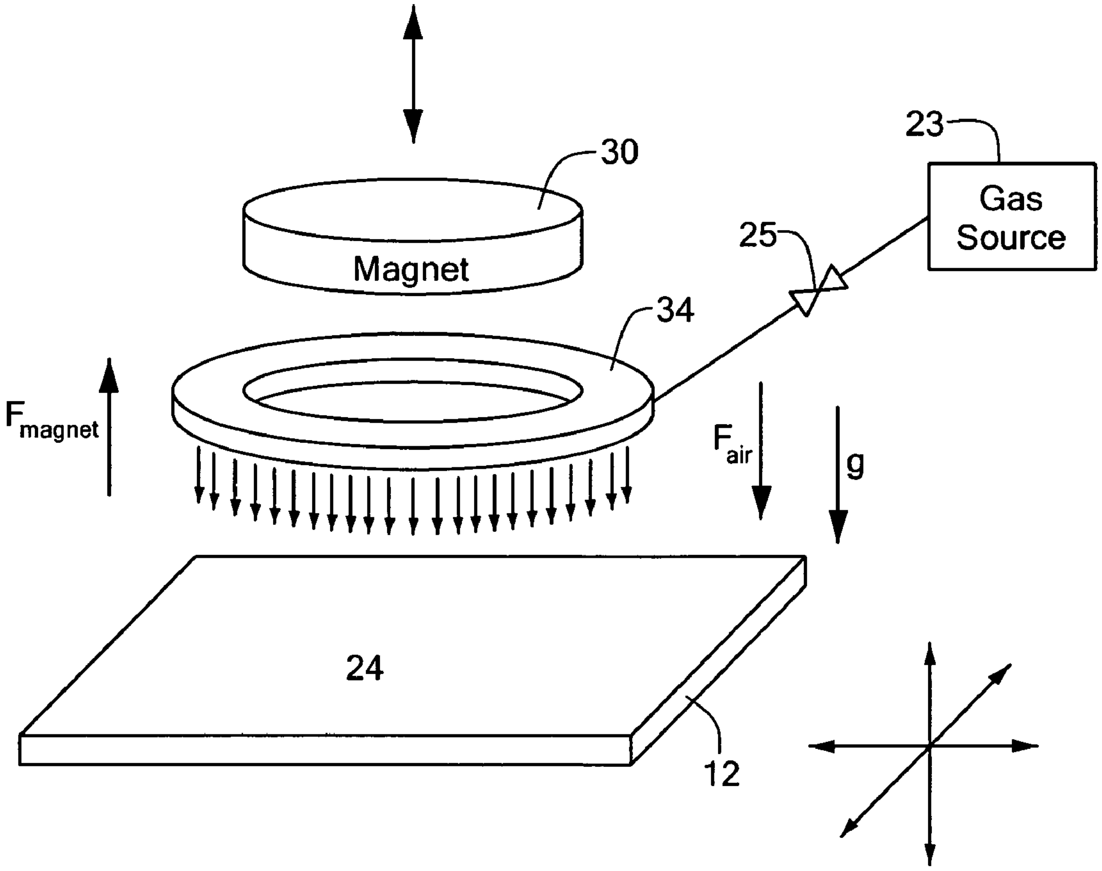
FIG. 2 is a highly schematic three-dimensional view showing the general operating principle of the handling systems of the subject invention.

The overall principle underlying the subject invention is depicted in FIG. 2. Magnet 30 (which could be an electromagnet but in the examples that follow is preferably a permanent magnet) serves as a magnetic chuck providing force $F_{magnetic}$ on substrate 12 which includes at least some ferromagnetic, ferrous, or magnetic material. For certain flexographic printing plates, the substrate is steel and surface 24 is coated with a photopolymer resin layer. Gas (e.g., air) chuck 34, in turn, connected to gas supply 23 through valve 25 provides a film of air between the substrate 12 and air chuck 34 providing force $F_{air}$. When the magnetic force $F_{magnetic}$ equals the combined forces of the blowing air ($F_{air}$) and gravity (g), equilibrium is attained and substrate 12 can be maneuvered in the direction shown up or down, left or right, or in and out of the plane of FIG. 2

If an electromagnet is used for the magnetic chuck, releasing substrate 12 is accomplished by stopping the current flow to the electromagnet. As discussed above, however, in the examples herein, magnet 30 is typically a permanent magnet (actually, usually one of many magnets) to keep costs low and to easily control the magnetic flux across the air gap. To release substrate 12 when magnet 30 is a permanent magnet, magnet 30 is moved away from air chuck 34 whereupon the magnetic attraction force becomes less than the force on substrate 12 due to the air blowing downward from air chuck 34 ($F_{air}$) and the force of gravity (g). Alternatively, it would also be possible to provide relative motion between magnet 30 and air chuck 34 by moving air chuck 34 away from magnet 30.

Figure 10:
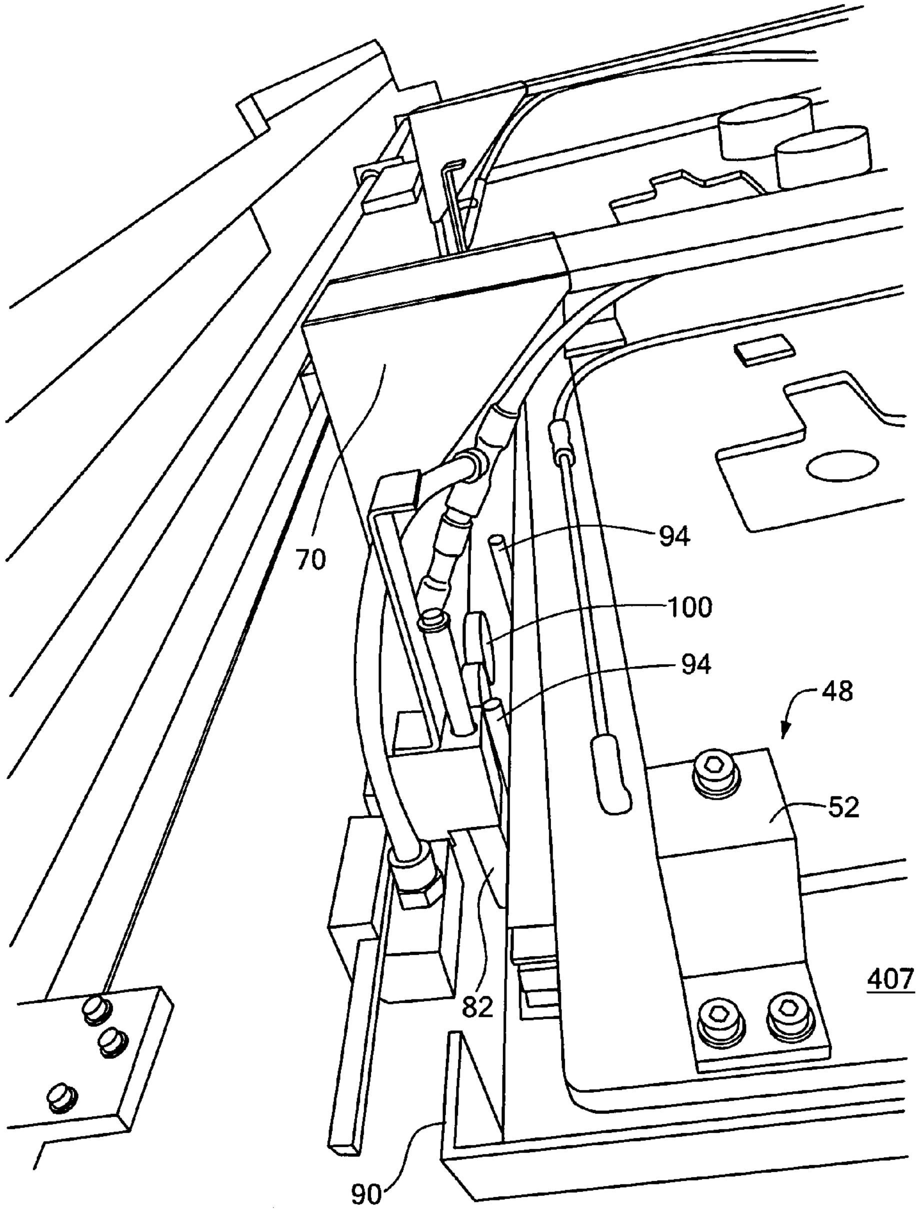
Figure 11:
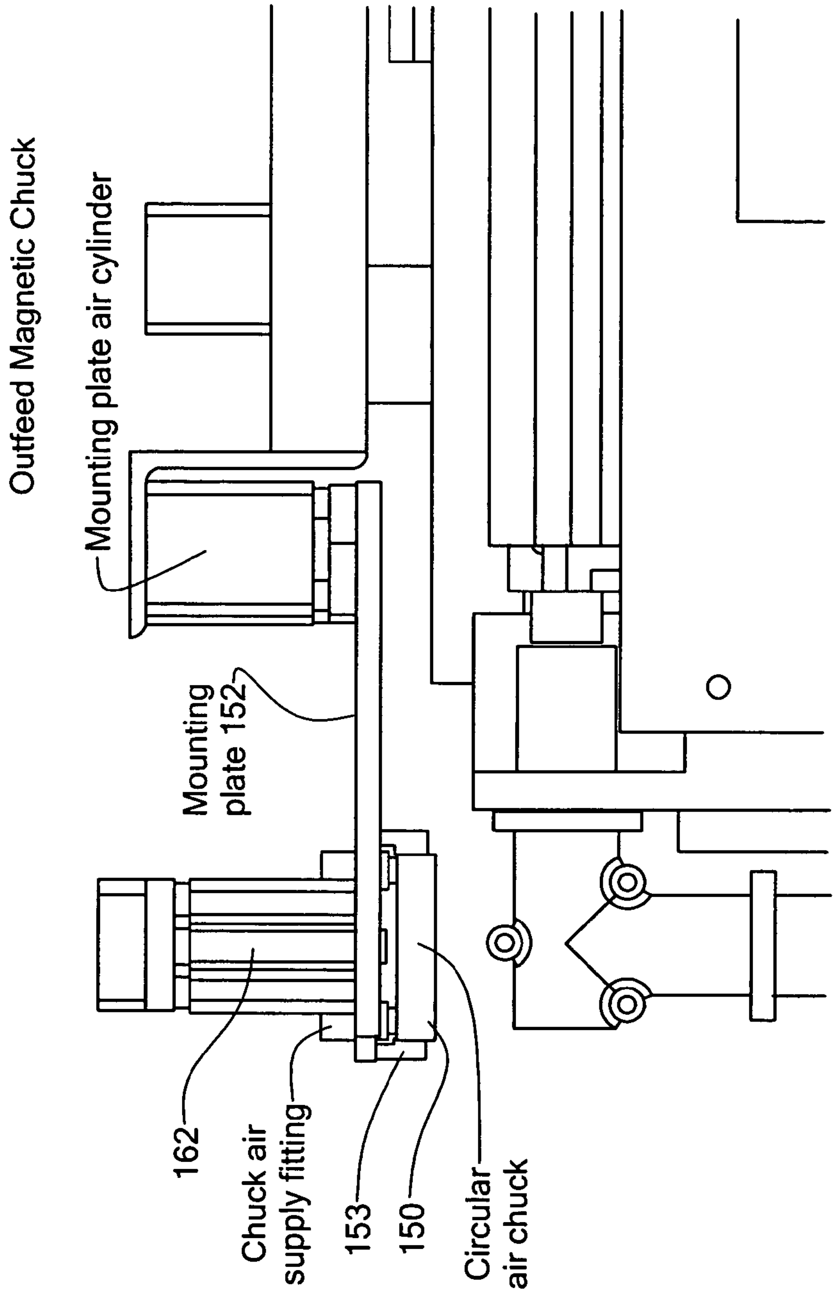
FIG. 11 is a schematic side view of another example of a handling system in accordance with the subject invention.
Figure 12:
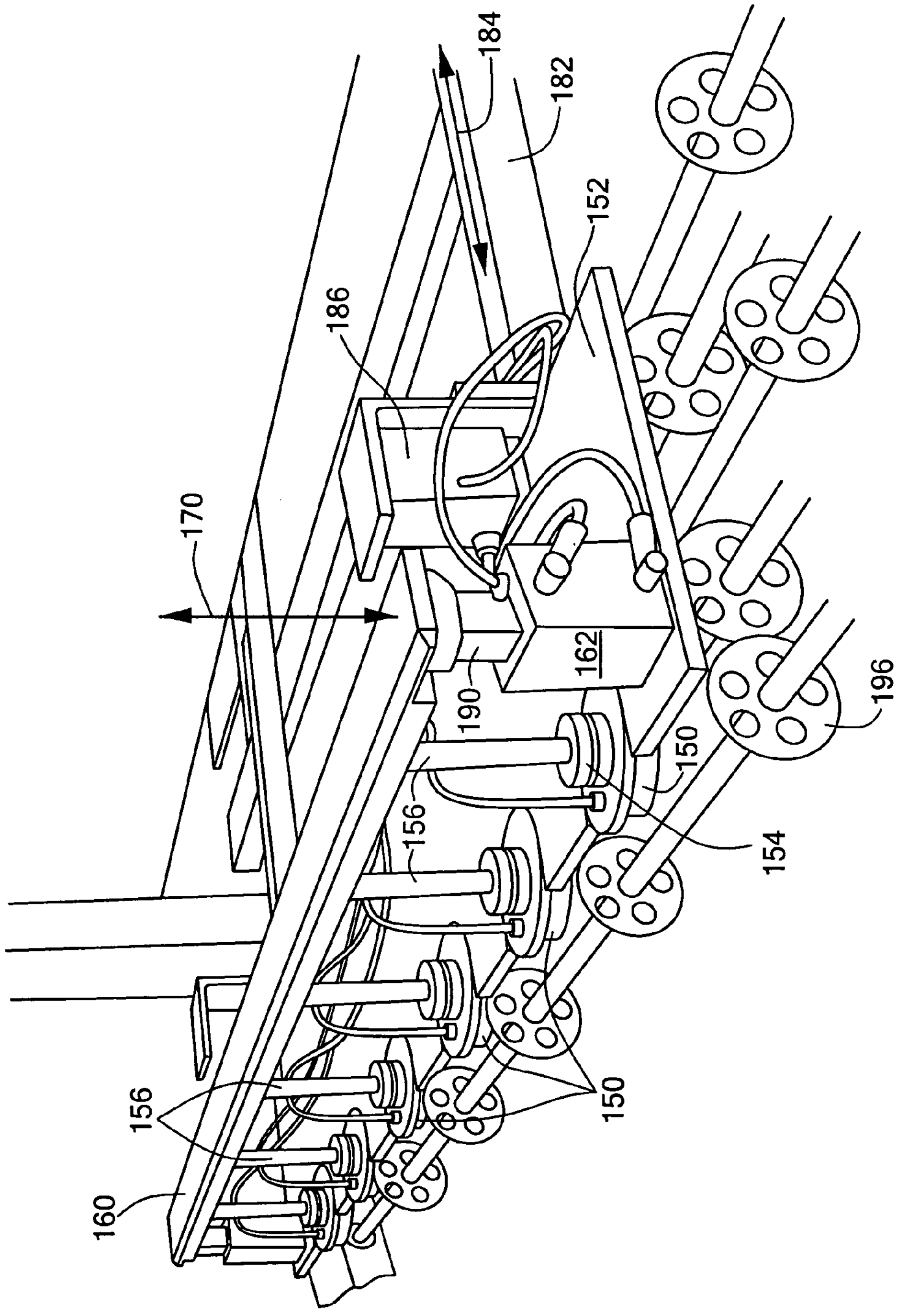
FIGS. 12 and 13 are schematic three-dimensional views showing the handling system of FIG. 11 in place in a CTP machine.
Figure 13:
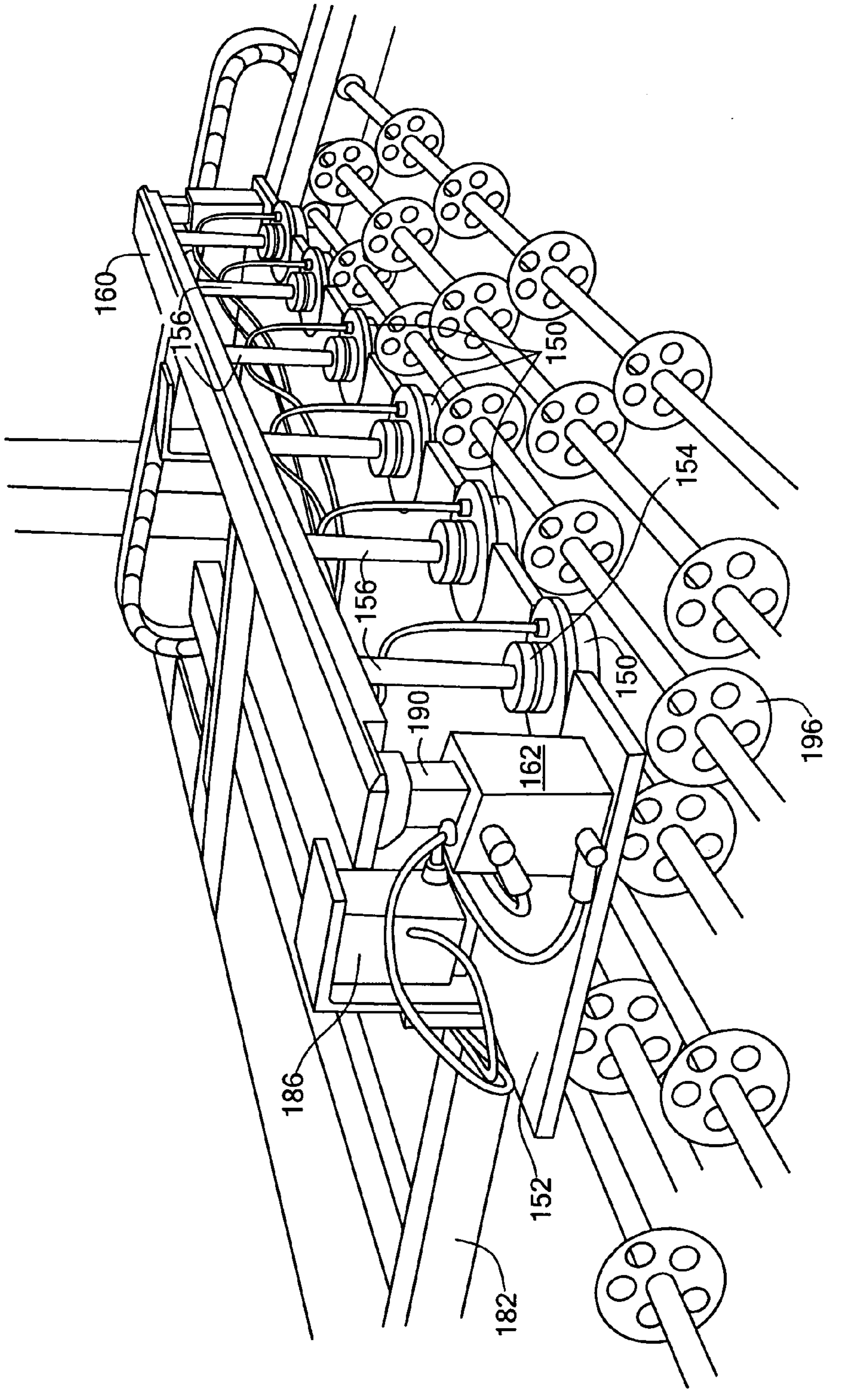

In the preferred embodiment, the subject invention is used at two locations in CTP machine 10, FIG. 1. In general, after flexographic printing plates are manually loaded into the trays of in-feed section 13 and fed to loading area 16, they are then transferred to imaging module 18 by handling system 14 configured as shown in FIGS. 3-10. After imaging, the plates are transferred from imaging module 18, FIG. 1 to out-feed section 22 by handling system 20 configured as shown in FIGS. 11-13.

Figure 3:
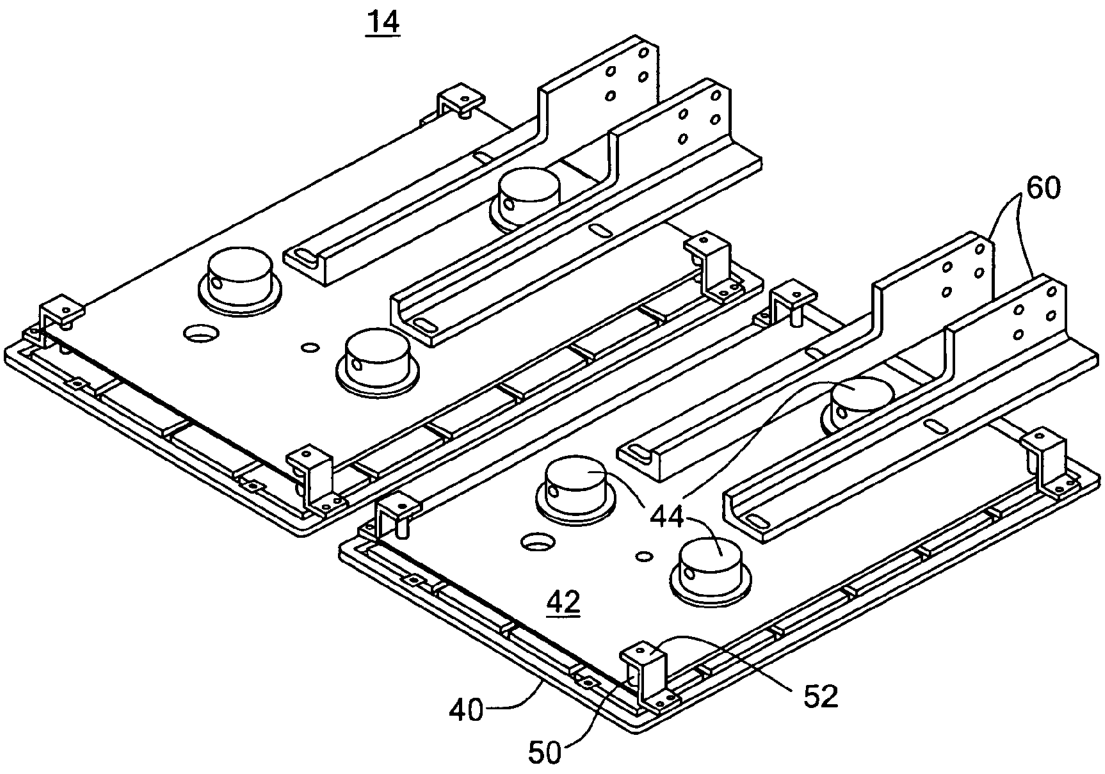
FIG. 3 is a schematic three-dimensional isometric view of one example of a handling system in accordance with the subject invention.

Handling system 14, FIG. 3 includes left and right subsystems each of which are identical. Air chuck 40 is in the form a large area plate with an array of gas (typically air) orifices in the lower surface thereof. Air chuck 40 is mounted to magnetic chuck 42 also in the form of a large area plate with an array of permanent magnets attached to the bottom surface thereof. Magnetic chuck 42 is configured to alternately attract substrates for handling and to release substrates for placement on the vacuum platen of imaging module 18, FIG. 1. Magnetic chuck 42, FIG. 3 moves with respect to air chuck 40 closer to it as shown in the right hand portion of FIG. 3 and also away from air chuck 40 as shown at the left hand portion of FIG. 3.

In the embodiment shown, this movement is effected by actuators in the form of three air cylinders 44. Each air cylinder is attached to magnetic chuck 42 and has a piston contacting air chuck 40. When the air cylinders 44 are pressurized, their pistons drive magnetic chuck 42 further away from air chuck 40 to release the substrate. Springs or any type of biasing mechanism such as spring 50 between mount 52 and the top surface of magnetic chuck 42 bias magnetic chuck 42 towards or closer to air chuck 40. Thus, when air cylinders 44 are not pressurized, magnetic chuck 42 is positioned to attract substrates to air chuck 40. The substrates, however, as explained above, do not actually contact air chuck 40 due to the film of air provided by air chuck 40 between air chuck 40 and the substrate. This mechanism for configuring the magnetic chuck to alternately attract and release the substrate, however, is not a limitation of the subject invention.

Robotic interface mount 60 is typically mounted to air chuck 40 through magnetic chuck 42 such that magnetic chuck 42 moves up and down with respect to mount 60. Mount 60 allows the handling system to be maneuvered to transfer a substrate from loading area 16, FIG. 1 of in-feed section 13 to the vacuum platen of imaging module or station 18. Mount 60, FIG. 3 also allows the handling system to be maneuvered up and down to bring magnetic chuck 42 close enough to a substrate to pick it up.

In the embodiment shown in FIG. 3, there are two side by side handlers for transferring substrates two at a time or for transferring one larger substrate. The number and size of the handlers depends on the particular machine, the substrates, and to some extent the applicable industry. The two side by side handler configuration of FIG. 3 was designed with the form, fit, and function requirements in mind for existing CTP machines equipped with standard suction cup type handlers.

Figure 4:
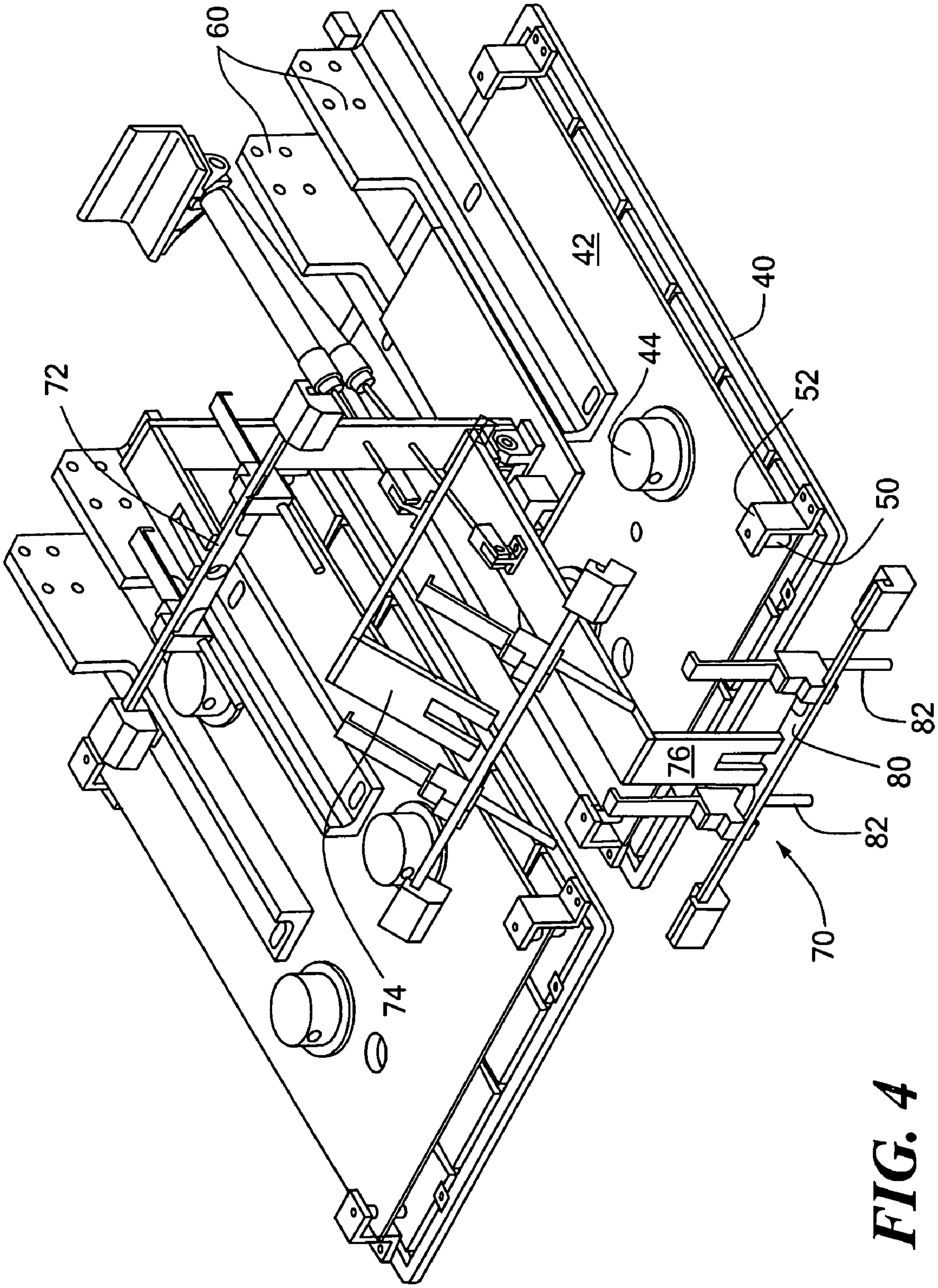
FIG. 4 is a view similar to FIG. 3 with the addition of the slip sheet removal subsystem of the subject invention.

FIG. 3 does not show slip sheet removal subsystem 70, FIG. 4 which is maneuverable from the position shown at 72, through the position shown at 74, to the position shown at 76. Flexographic printing plates, as explained above, are stacked with paper interleave or slip sheets between them to protect the delicate top surface of the printing plates. These slip sheets must be removed prior to imaging—a function accomplished by slip sheet removal subsystem 76 as delineated in co-pending patent application Ser. No. 09/882,154 filed Jun. 15, 2001 hereby incorporated herein by this reference. Just before a substrate covered by a slip sheet is to be supported a close distance away from air chuck 40 by the air layer provided by air chuck 40 and the attractive forces of magnetic chuck 42, slip sheet removal subsystem 76 moves down into the position shown at 70 and forced pulsating air exits the inbound side of bar 80 to blow the slip sheet off the substrate rearward and into a receptacle behind loading area 16, FIG. 1.

Magnets also on the inboard side of bar 80, FIG. 4 attract the substrate so it is not moved by the forced air as discussed infra. Pins 82 prevent the substrate from following the magnets as subsystem 76 is moved back up through position 74 to position 72 as also discussed infra.

Figure 5:
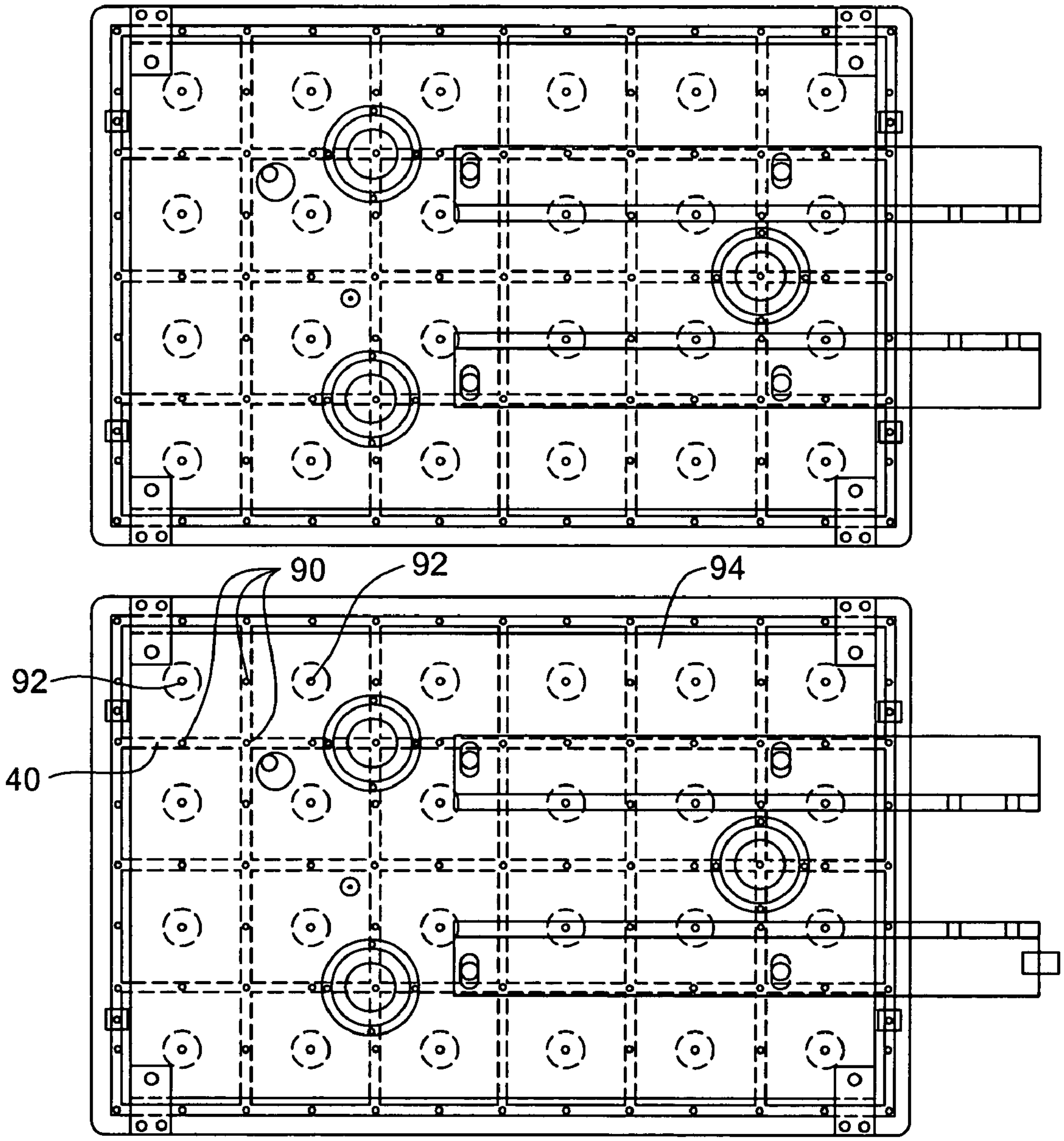
FIG. 5 is a schematic plan view of the handling system showing in FIG. 3.

FIG. 5 shows both the top side of air chuck 40 and the regular array of air orifices 90 and also the top of magnetic chuck 42 and the array of permanent magnets 92 shown with dashed lines. Typically, each zone 94 is 3.5 by 3.5 inches and there are 24 zones in a 6×4 array. Each zone includes one centrally located magnet 92 1.0 inches in diameter and 0.25 inches thick surrounded by eight air orifices. The supply air pressure at each orifice is typically between 20 and 80 psi and each magnet had an attractive force of 27 lbs. But, these design parameters are specific to one particular CTP machine.

Figure 6:
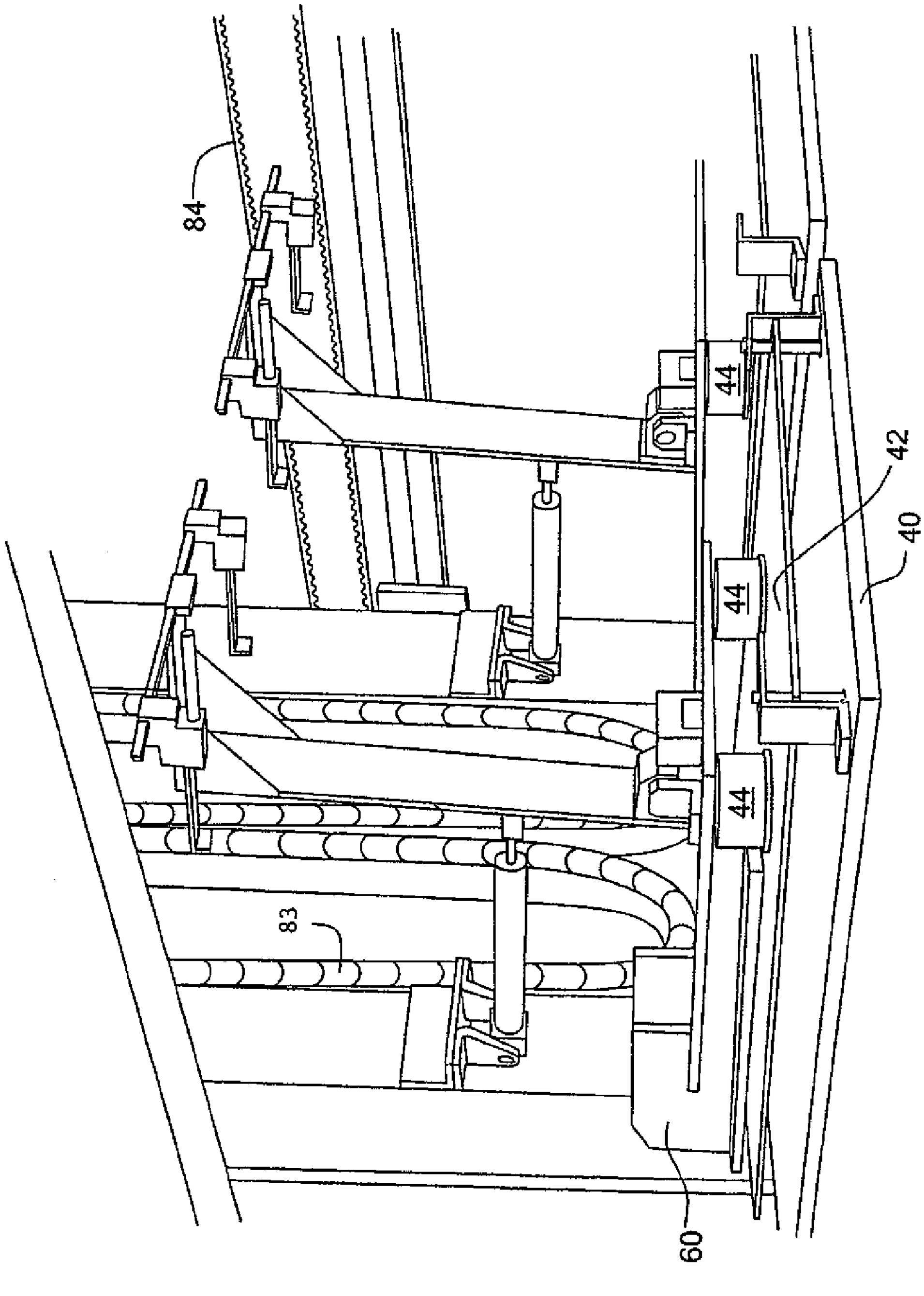
FIG. 6 is a schematic three-dimensional side view of the handling system shown in FIG. 4 in place within a CTP machine.
Figure 7:
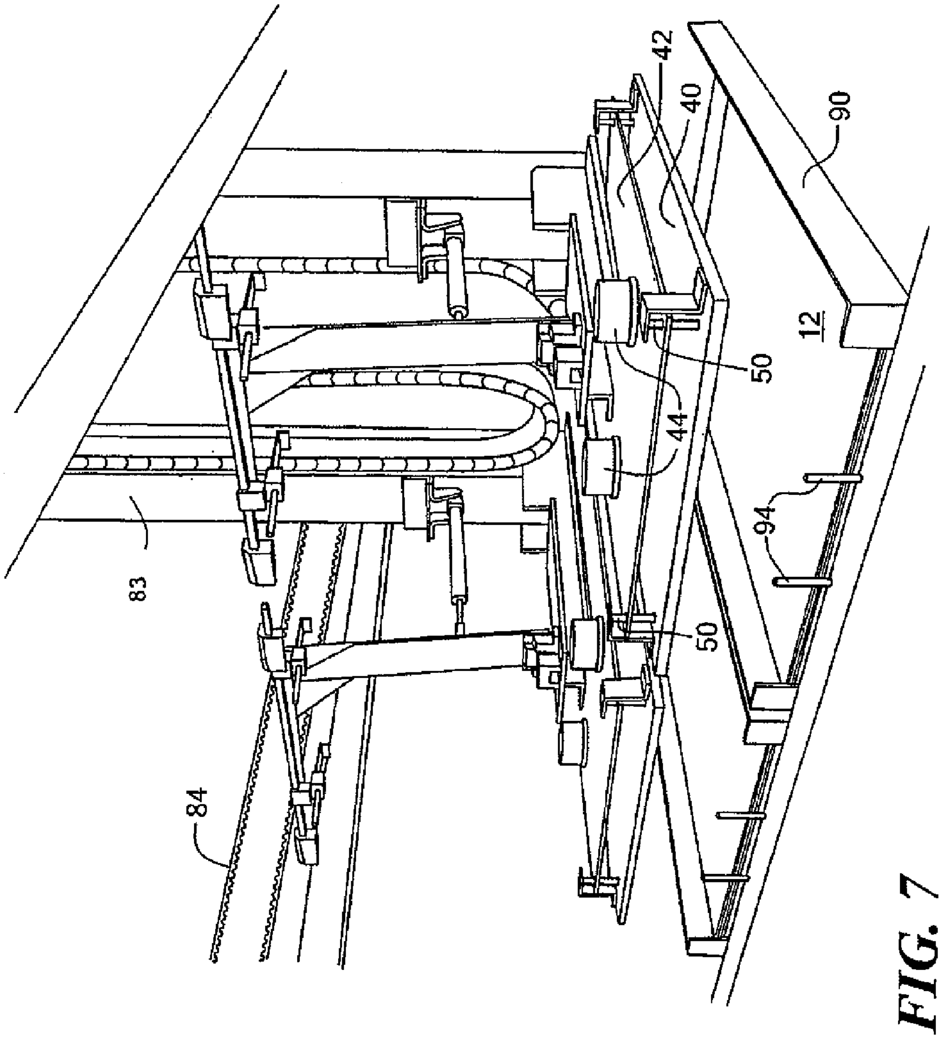
FIG. 7 is a schematic three-dimensional view similar to FIG. 6.
Figure 8:
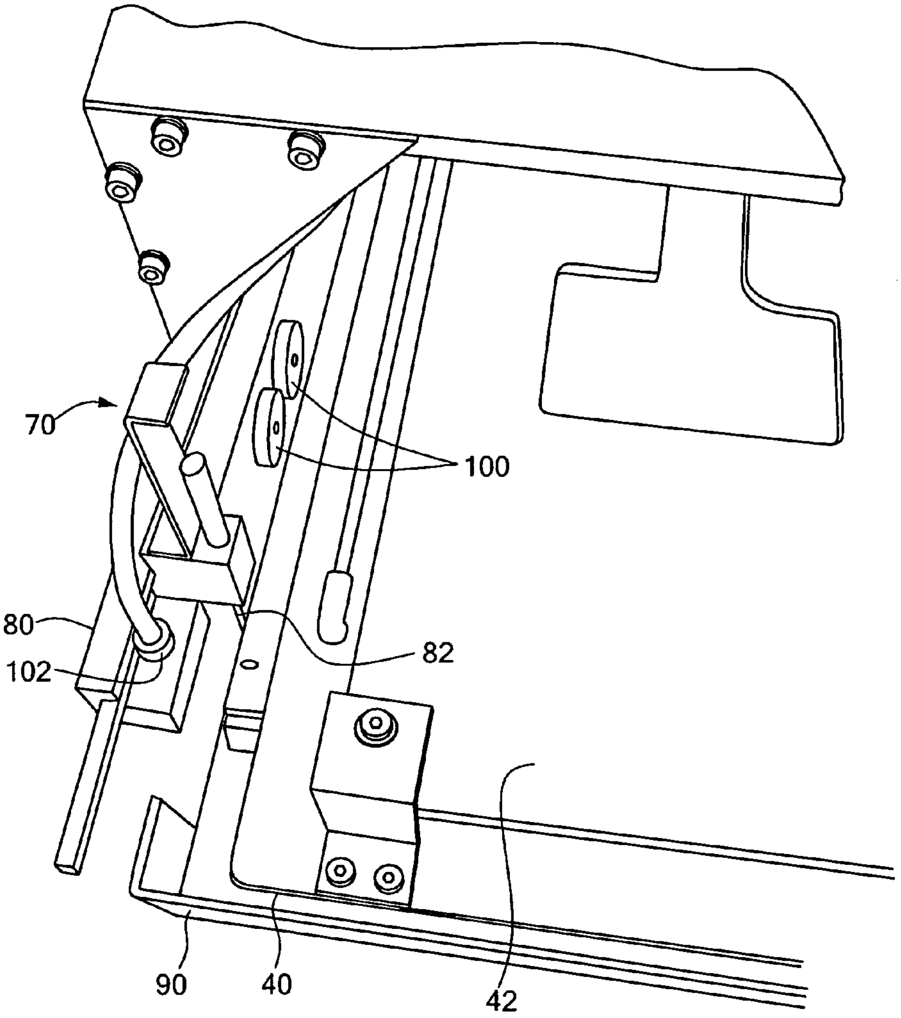
FIG. 8 is a schematic three-dimensional top view showing the operation of the slip sheet removal subsystem of the subject invention.
Figure 9:
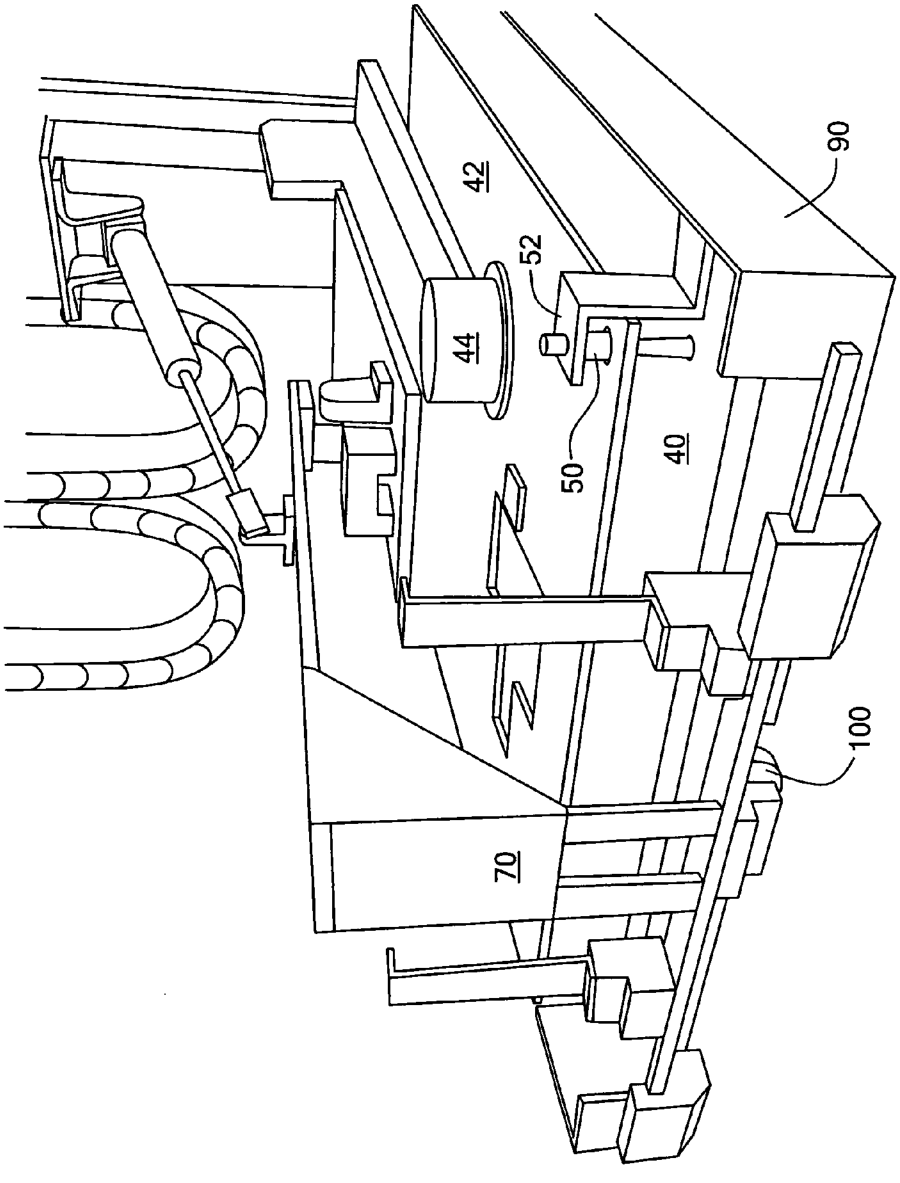
FIGS. 9-10 are schematic three-dimensional views similar to FIG. 8.

FIG. 6 shows mounts 60 connected to a belt driven robotic subsystem wherein belt 83 raises and lowers the handlers and belt 84 moves them right and left in the figure. FIG. 7 shows substrates 12 in trays 90 in loading area 16; FIG. 1 after being manually loaded at in-feed section 13. Pins 94, FIG. 7, which retract down in trays 90, assist in preventing movement of the substrates as the slip sheets are removed by subsystem 70. FIG. 8 shows subsystem 70 in position to remove the slip sheets and the inboard side of bar 80 which includes magnets 100 and nozzle 102. There is also another air nozzle at the other end of bar 80 and also an air nozzle between magnets 100. Pins 82 are also shown in FIG. 10.

Controller 21, FIG. 1 is programmed as follows in the preferred embodiment. After the unexposed flexographic plates are removed from their packaging and loaded into the trays in in-feed section 13, the trays are placed onto shelves and slid onto locating pins. Control system 21 then selects a shelf with the media and moves it into a lowered position in loading area 16. Controller 21 moves all other shelves to the storage position. Air cylinders 44, FIG. 7 are actuated to move magnetic chuck 42 away from air chuck 40. Slip sheet removal subsystem 70 is then brought down into the position 76 shown in FIG. 4 and the slip sheet blow off nozzles begin to blow in a pulsating pattern. The whole handler then moves up a fixed distance from the top plate and, while the system is moving up and for a fixed time and while it is in the up position, the blow off nozzles of slip sheet removal subsystem 70 are pulsed on and off until the slip sheet is blown off the plate and into a paper disposal area behind in-feed section 13, FIG. 1. As sensors detect that the slip sheet has been removed, air cylinders 44, FIG. 7 are depressurized allowing magnetic chuck 44 to move closer to air chuck 40 by the action of springs 50. The air supply to air chuck 40 is then turned on and the handlers are moved down to pick up the top plate on the media stack. The handler heads are then brought up to the travel position and the robot traverses from plate loading area 16, FIG. 1 to a position over the platen of imaging module 18. The robot lowers until air chuck 40, FIG. 4 is approximately ½ inch from the surface of the platen. Air cylinders 44 are again actuated to raise magnetic chuck 42 to the release position thus releasing the printing plates. Then, air cylinders in the platen actuate pusher pins and push the printing plates against the platen banking pins. The imaging head of the imager then exposes the plates and the platen moves out to the out-feed position of imaging module 18, FIG. 1.

As explained above, the embodiment shown in the figures discussed thus far is not the only embodiment of the subject invention. For maneuvering substrates from imaging module 18 to out-feed section 22, they are more or less dragged by handling system 20 shown in one example in FIG. 11-13. Air chuck 150 is now in the form of a number of linearly arranged small area circular plates each mounted to mounting platform 152 by gimbal assembly 153 and the magnetic chuck is attached to the movable plate 152 in a movable fashion up and down as explained below. Gimbal assembly 153 allows the air chucks to tilt in two axes as required to pick-up and drag a printing plate.

As better shown in FIGS. 12 and 13, magnets 154 are each connected via bar 156 to cross member 160 driven by an actuator subsystem in the form of air cylinder 162 which is pressurized to extend and retract in the direction shown by vector 170 to drive cross member 160 up and down. Thus, air cylinder 162, connected to mounting plate 152, includes a piston connected to the permanent magnets 150 via cross member 160 and bars 156 to urge the permanent magnets closer to and away from the end portion of a substrate located beneath air chucks 150.

Robotic arm 182 moves in the direction shown by vector 184 and is attached to moving plate 152 by air cylinder 186 which moves mounting plate 152 up and down in the figure with respect to robotic arm 182. FIG. 13 shows these features as well as piston 190 of air cylinder actuator 162.

When piston 190 is retracted, magnets 154 are brought closer to air chucks 150 and when mounting plate 152 is lowered by actuator 186 the substrate is attracted to the magnets but separated by the air layer provided by air chucks 158. Retraction of robot arm 182 then drags the substrate onto the roller conveyer 196 of out-feed section 22, FIG. 1.

Controller 21, in one example, is thus programmed as follows. The system shown in FIGS. 12-13 is moved to the out-feed head pick up position while the air supply to air chucks 150 is turned on and air cylinder 162 moves magnets 154 down into the recessed center of air chucks 150. When the out-feed head is in position, air chuck 186 moves mounting plate 152 down to pick up an exposed printing plate. Air cylinders 186 are then retracted moving mounting substrate 152, the air chucks, the magnets, and one or two printing plates up and away from the platen of the imaging section. The whole system is then retracted rearward to drag the printing plates directly over out-feed conveyer rollers 196. Air cylinders 162 are then actuated to move magnets 154 up and out of air chucks 150 to release the printing plates onto out-feed conveyer rollers 196.

The two embodiments of the handling system of the subject invention shown at 14 and 20 in FIG. 1 provide better handling of delicate items including, but not limited to, flexographic printing plates. At no time is there any contact between the delicate substrate surface and the handling system. Damage, scratching, or marring of the surface of the substrate is prevented and at the same time the handling systems provides positive maneuvering of the printing plates. The handling system of the subject invention is compatible with existing robotic handling systems and the substrates need not be rotated or turned over prior to handling.

The subject invention, however, is not limited to the embodiments shown for handlers 14 and 20, FIG. 1. Instead, the subject invention is applicable to any system in which items are maneuvered by the use of magnetic attraction in combination with an air chuck which provides a layer of air between the plate and the handling system so that at least the top surface of the item never contacts any structure of the handling system. Thus, in accordance with the method of the subject invention, a substrate is magnetically attracted to an air chuck to overcome the force of gravity on the substrate and the air chuck is actuated to provide a film of air between the substrate and the air chuck. To release the item, the magnetic force is removed.

Figure 14:
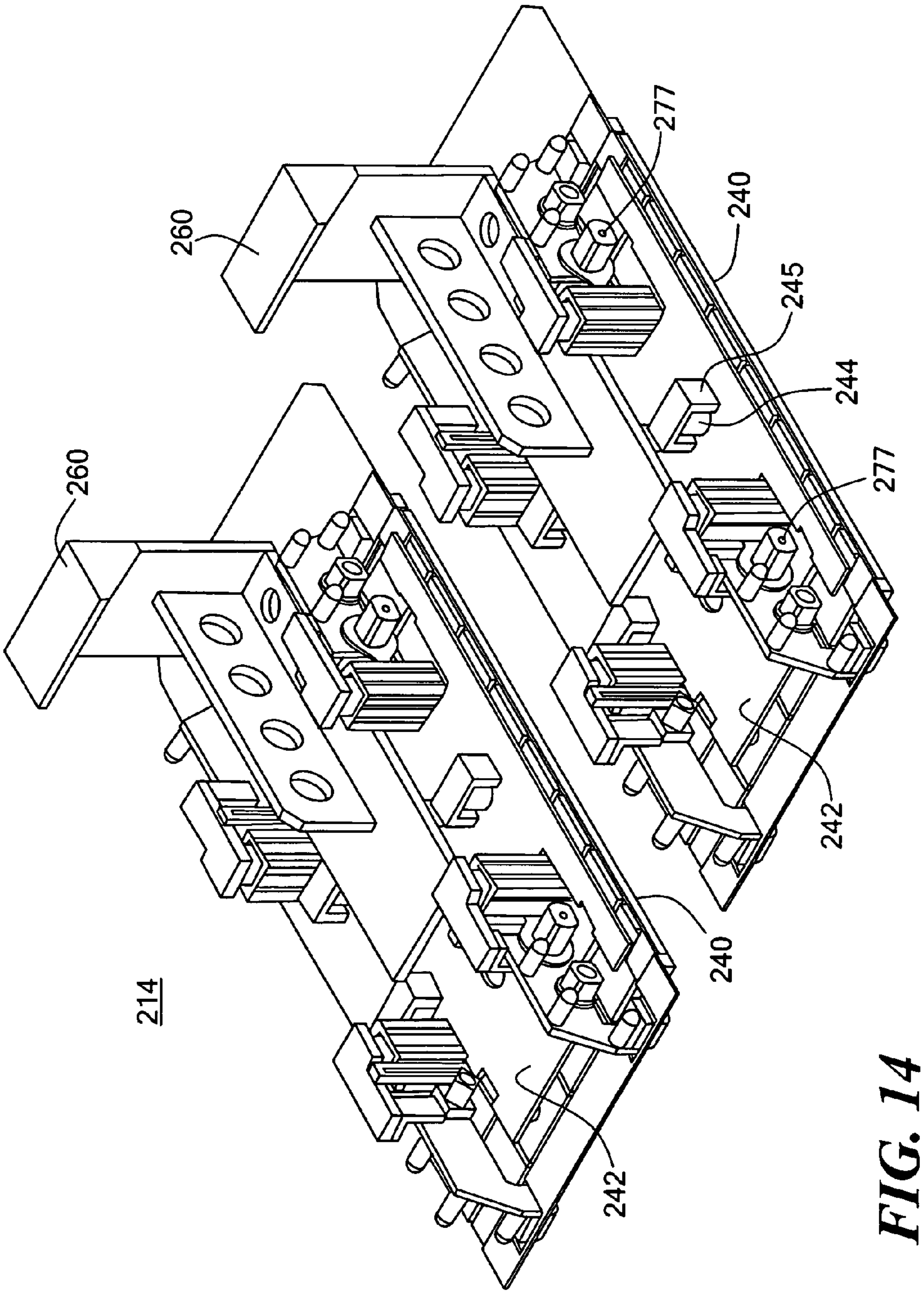
FIG. 14 is a schematic three-dimensional irometric view of another example of a handling system in accordance with the subject invention.

In another embodiment, handling system 214, FIG. 14 includes left and right subsystems each of which are identical. Air chuck 240 is in the form a large area plate with an array of gas (typically air) orifices in the lower surface thereof. Air chuck 240 is mounted to magnetic chuck 242 also in the form of a large area plate with an array of permanent magnets attached to the bottom surface thereof. Magnetic chuck 242 is configured to alternately attract substrates for handling and to release substrates for placement on the vacuum platen of imaging module 18, FIG. 1. Magnetic chuck 242, FIG. 14 moves with respect to air chuck 240 closer to it as shown in the right hand portion of FIG. 14 and also away from air chuck 240 as shown at the left hand portion of FIG. 14.

In the embodiment shown, this movement is effected by actuators in the form of three air cylinders 244. Each air cylinder is attached to air chuck 242 and has a piston connected to the magnetic chuck through interface block 245. When the air cylinders 244 are pressurized, their pistons drive magnetic chuck 242 further away from air chuck 40 to release the substrate. The air cylinders 244 and the interface block 245 are sized so that when the cylinder is in the unpressurized state, magnetic chuck 242 is positioned to attract substrates to air chuck 240. The substrates, however, as explained above, do not actually contact air chuck 240 due to the film of air provided by air chuck 240 between air chuck 240 and the substrate. This mechanism for configuring the magnetic chuck to alternately attract and release the substrate, however, is not a limitation of the subject invention.

Robotic interface mount 260 is typically mounted to air chuck 240 through magnetic chuck 242 such that magnetic chuck 242 moves up and down with respect to mount 260. Mount 260 allows the handling system to be maneuvered to transfer a substrate from loading area 16, FIG. 1 of in-feed section 13 to the vacuum platen of imaging module or station 18. Mount 260, FIG. 3 also allows the handling system to be maneuvered up and down to bring magnetic chuck 242 close enough to a substrate to pick it up.

In the embodiment shown in FIG. 14, there are two side by side handlers for transferring substrates two at a time or for transferring one larger substrate. The number and size of the handlers depends on the particular machine, the substrates, and to some extent the applicable industry. The two side by side handler configuration of FIG. 14 was designed with the form, fit, and function requirements in mind for existing CTP machines equipped with standard suction cup type handlers.

Figure 15:
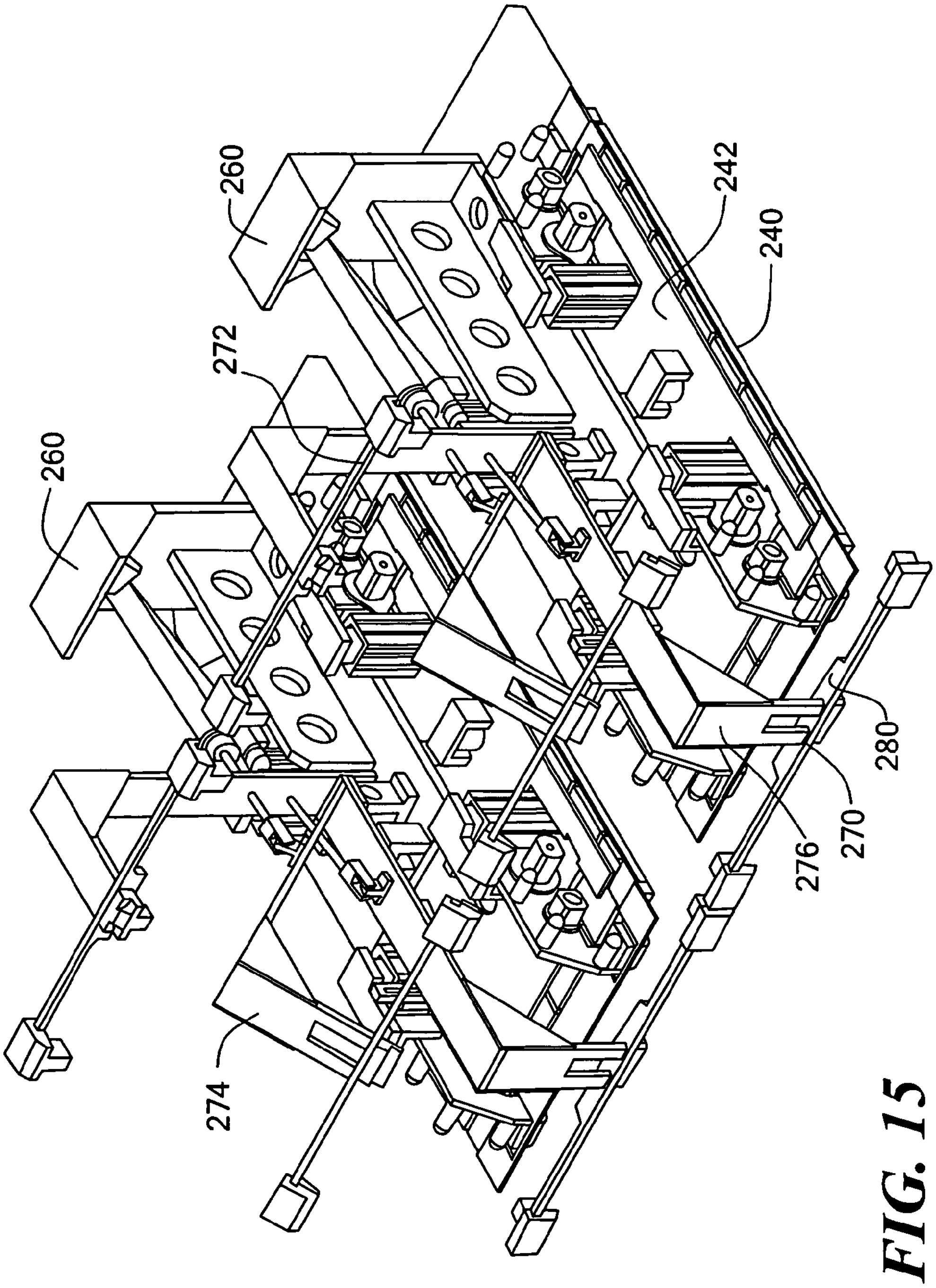
FIG. 15 is a view similar to FIG. 14 with the addition of the slip sheet removal subsystem of the subject invention.

FIG. 14 does not show slip sheet removal subsystem 270, FIG. 15 which is maneuverable from the position shown at 272, through the position shown at 274, to the position shown at 276. Flexographic printing plates, as explained above, are stacked with paper interleave or slip sheets between them to protect the delicate top surface of the printing plates. These slip sheets must be removed prior to imaging—a function accomplished by slip sheet removal subsystem 276 as delineated in co-pending patent application Ser. No. 09/882,154 filed Jun. 15, 2001 hereby incorporated herein by this reference and by tape dispenser mechanisms 277, FIG. 14 which are mounted on each of the corners of magnetic air chuck. Tape mechanisms 277 automatically dispense adhesive tape which runs in a continuous strip from a supply reel of "new" tape to a "take up reel" of used tape. The path of the strip is across a soft conformal "foot" that ensures good contact of the tape to the release paper, but does not mar or otherwise damage the photopolymer coating. An air cylinder is used to move the tape mechanism up and down. In the down position, the tape contacts the slip sheet, and as the cylinder moves the tape mechanism away from the stack of flexographic plates, the slip sheet is separated from the photopolymer coating. The tape mechanisms incorporate a tape advance feature that ensures a fresh area of tape is exposed each time it is used to contact the slip sheet. If slip sheet presence is detected by a sensor (not shown), the tape dispenser system is actuated to ensure the slip sheet no longer adheres to the substrate. Then just before a substrate covered by a slip sheet is to be supported a close distance away from air chuck 240 by the air layer provided by air chuck 240 and the attractive forces of magnetic chuck 242, slip sheet removal subsystem 276 moves down into the position shown at 270 and forced pulsating air exits the inbound side of bar 280 to blow the slip sheet off the substrate rearward and into a receptacle behind loading area 16, FIG. 1. Magnets also on the inboard side of bar 280, FIG. 15 attract the substrate so it is not moved by the forced air as discussed infra.

Figure 16:
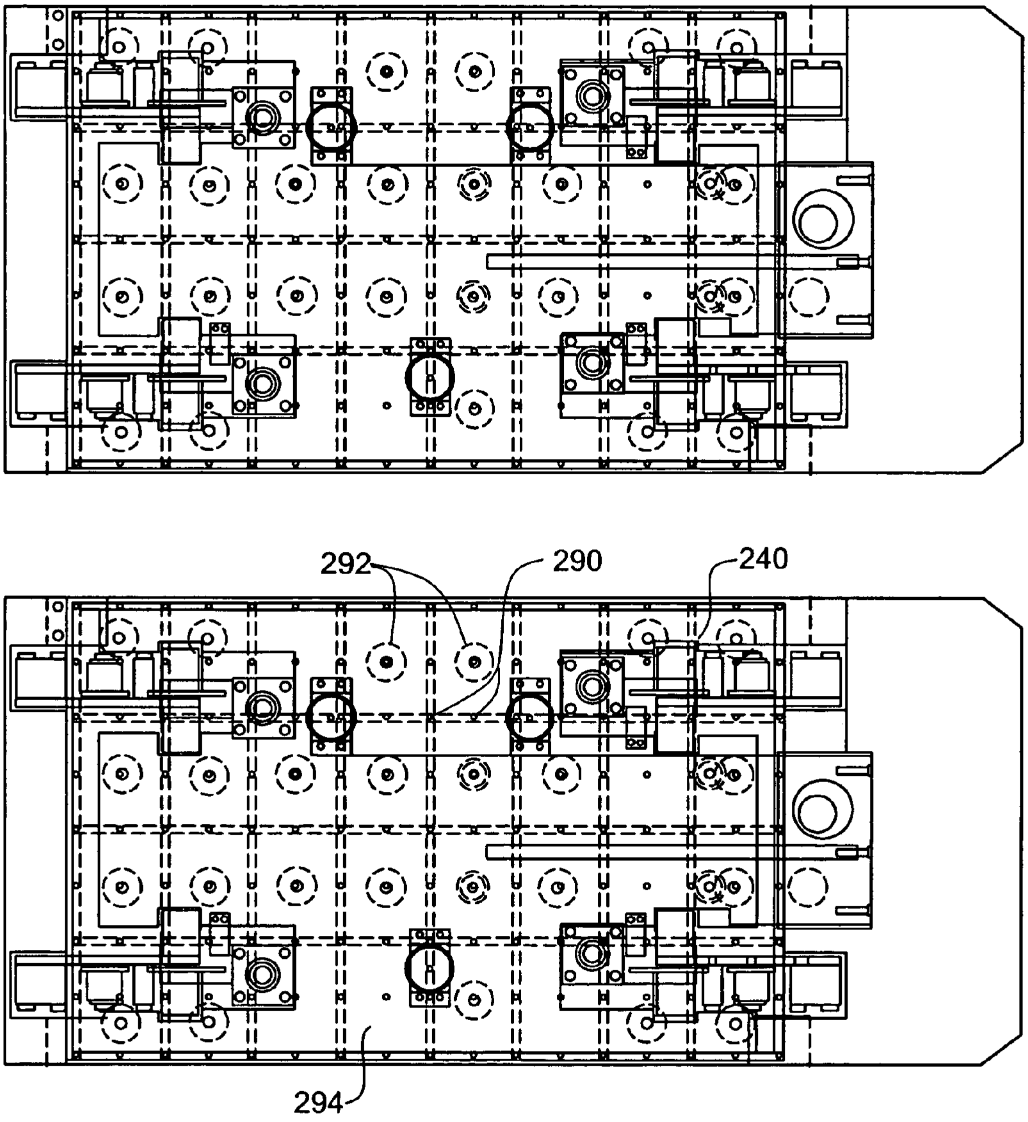
FIG. 16 is a schematic plan view of the handling system showing in FIG. 14.

FIG. 16 shows both the top side of air chuck 240 and the regular array of air orifices 290 and also the top of magnetic chuck and the array of permanent magnets 292 shown with dashed lines. Typically, each zone 294 is 3.5 by 3.5 inches and there are 24 zones in a 6×4 array. Each zone includes one centrally located magnet 292 1.0 inches in diameter and 0.25 inches thick surrounded by eight air orifices. The supply air pressure at each orifice is typically between 20 and 80 psi and each magnet had a strength of 27 lbs. But, these design parameters are specific to one particular CTP machine.

Figure 17:
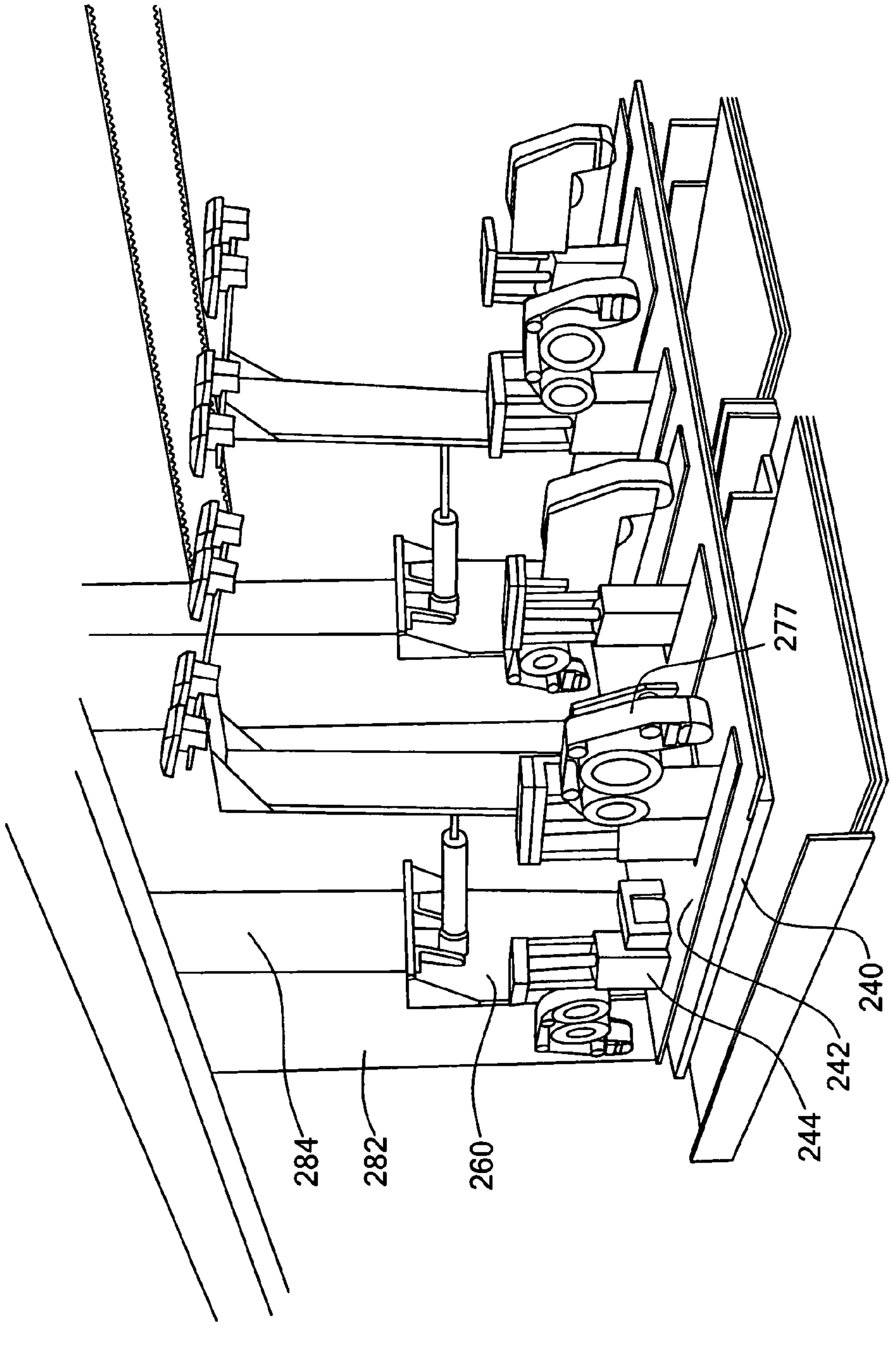
FIGS. 17-18 are schematic three-dimensional side views of the handling system shown in FIG. 15 in place within a CTP machine.
Figure 18:
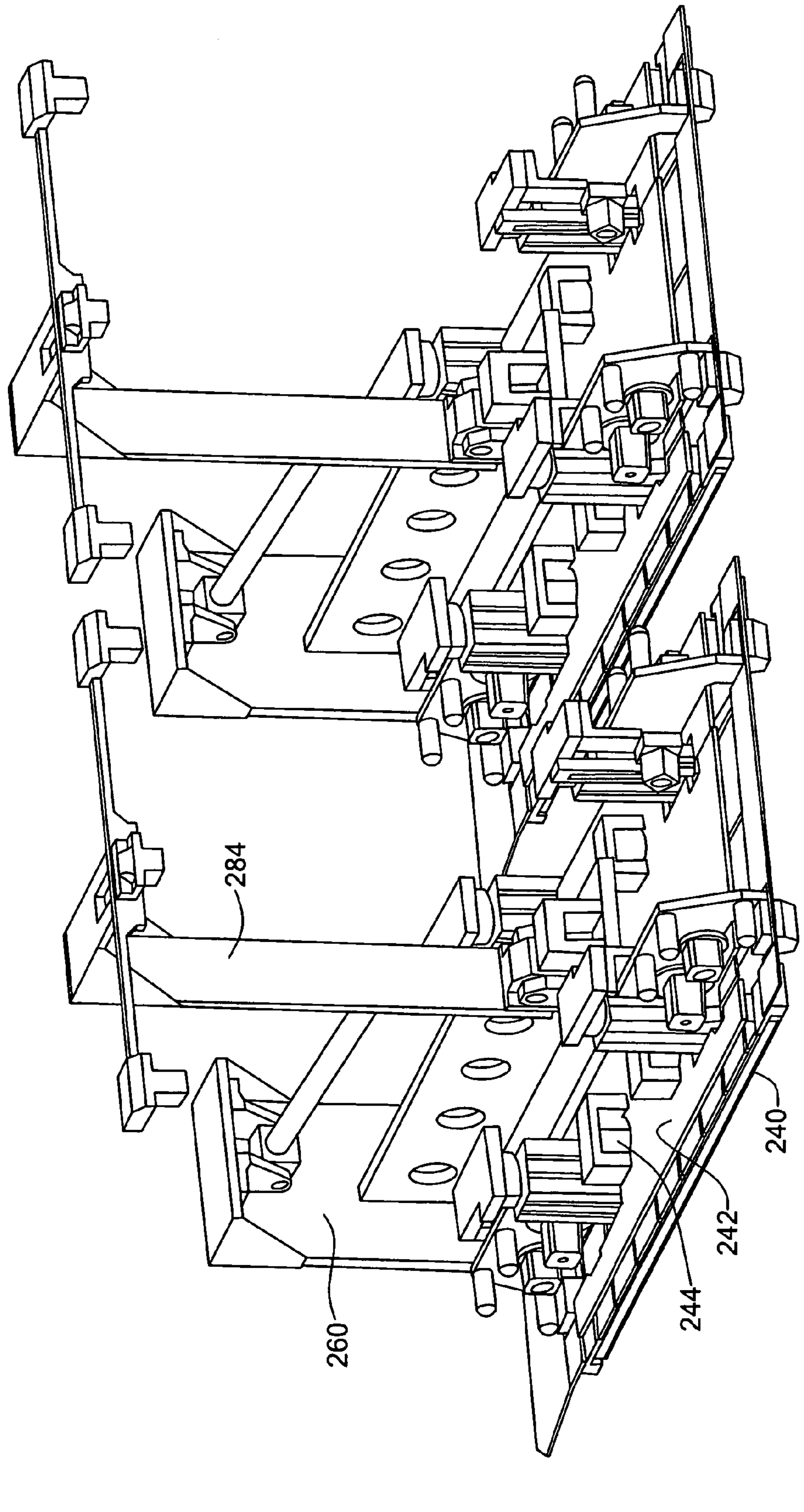
Figure 19:
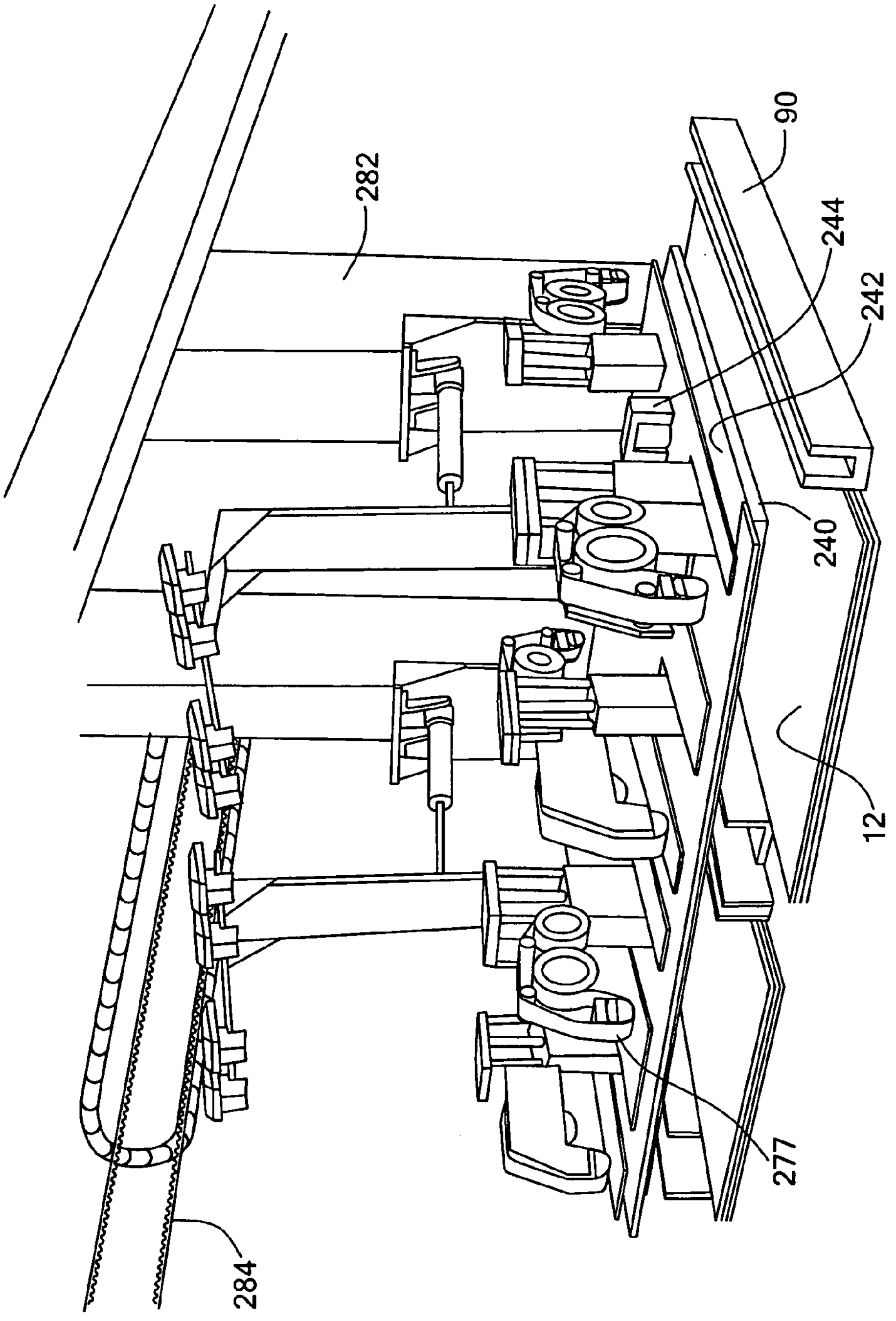
FIGS. 19-20 are schematic three-dimensional views similar to FIGS. 17-18.
Figure 20:
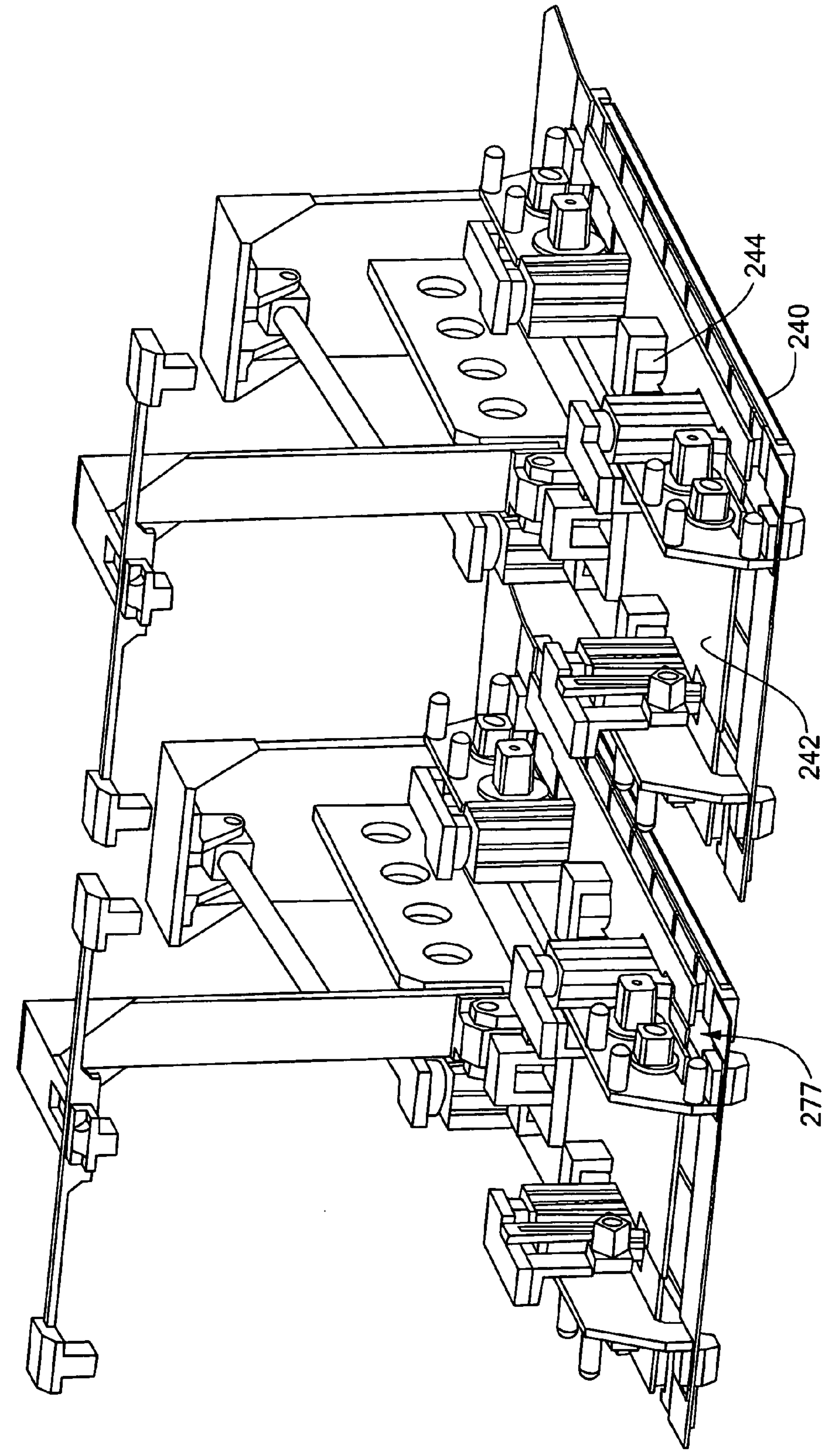
Figure 21:
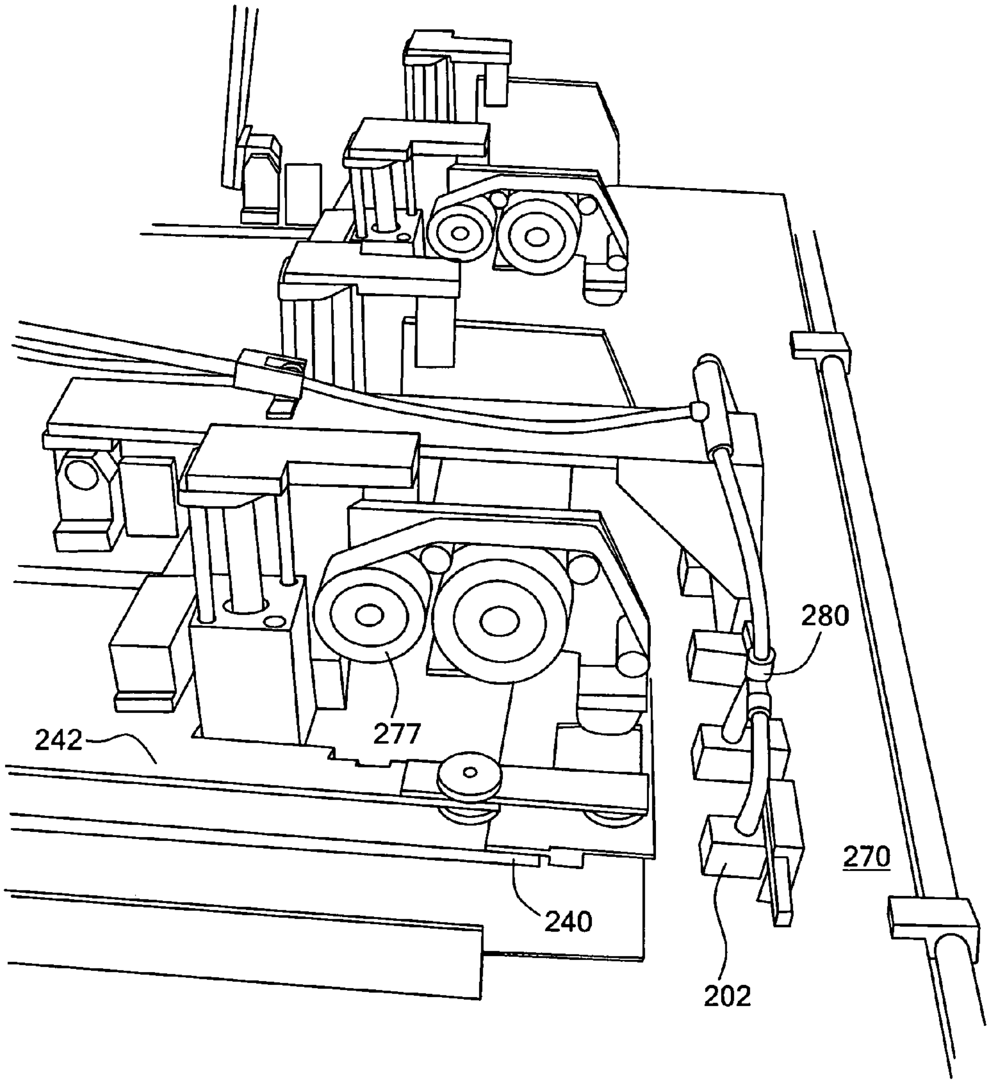
FIGS. 21-22 are schematic three-dimensional top view showing the operation of the slip sheet removal subsystem of the subject invention.
Figure 22:
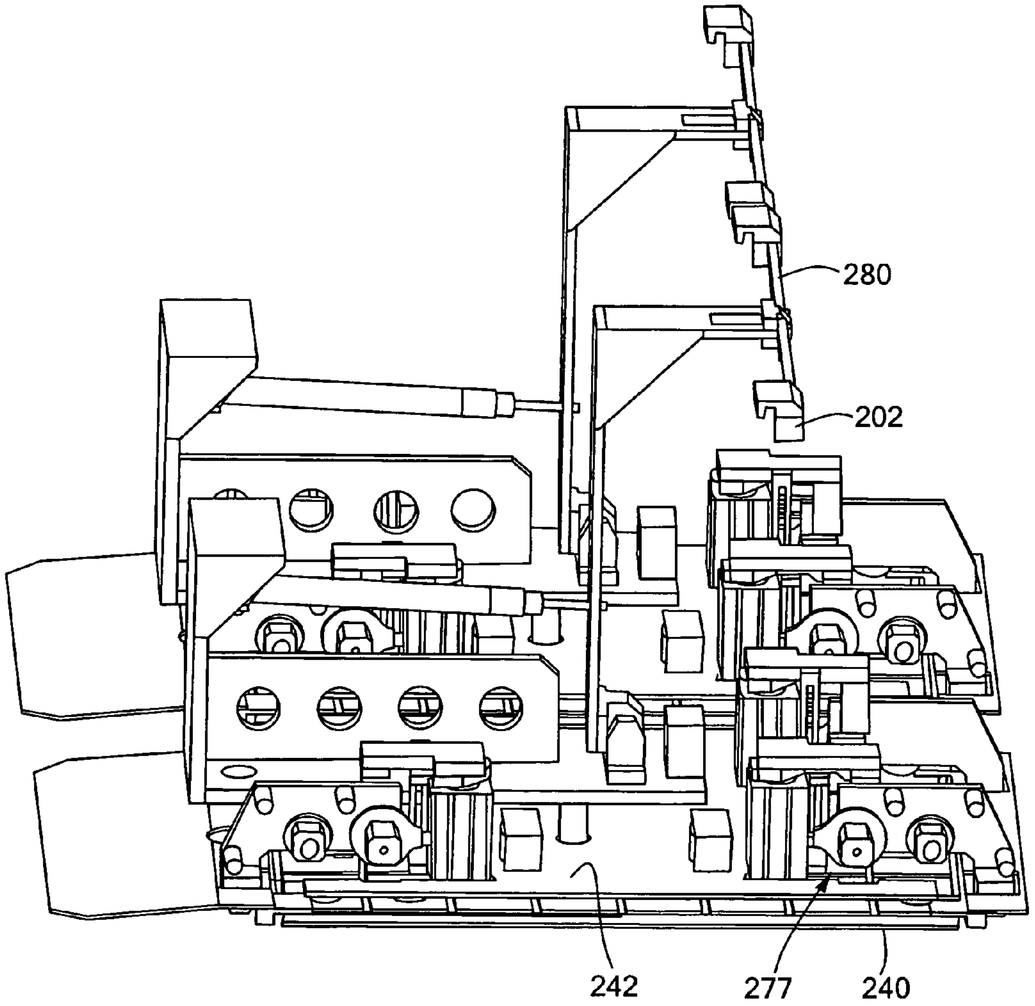
Figure 23:
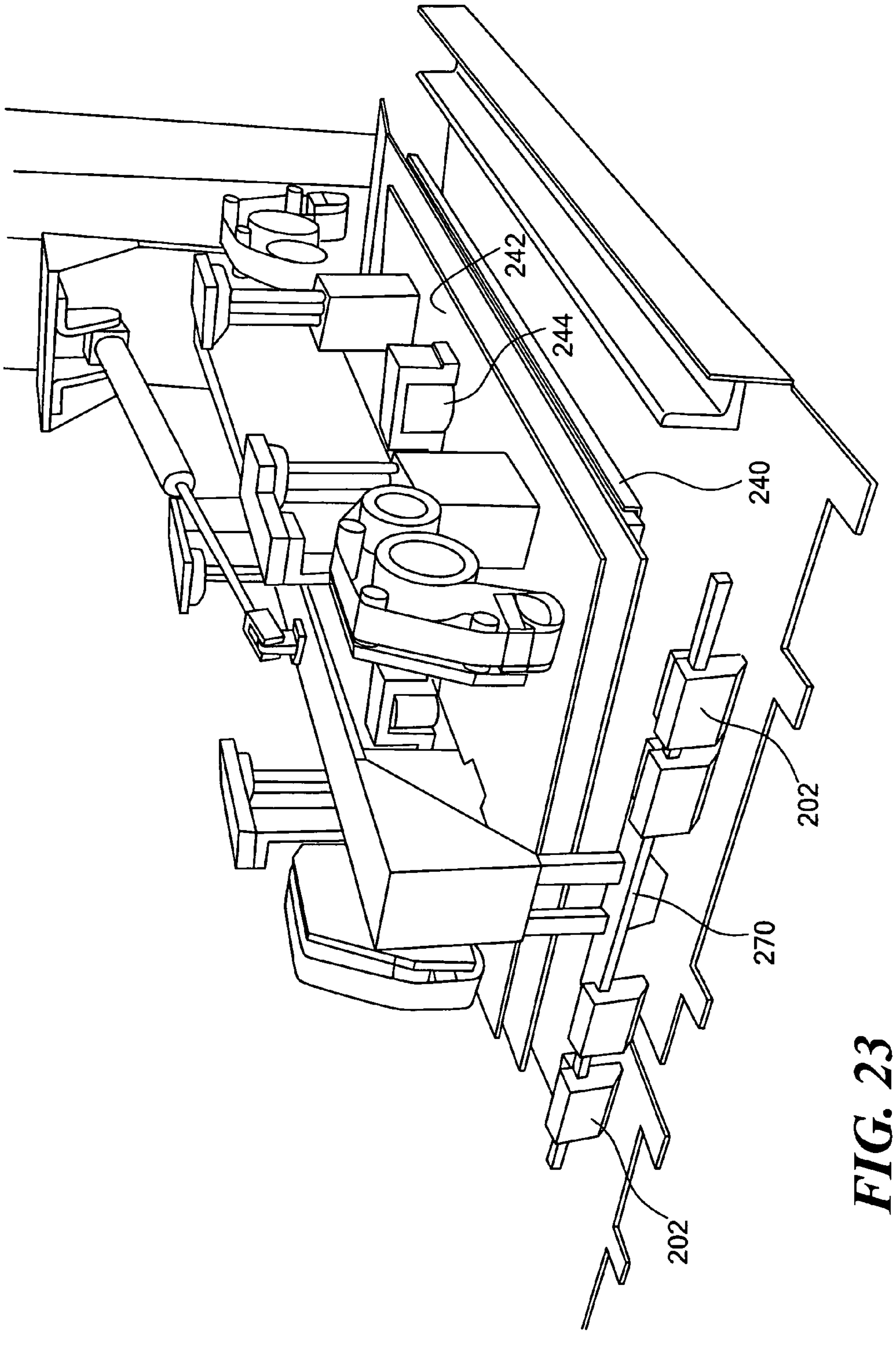
FIGS. 23-26 are schematic three-dimensional views similar to FIGS. 21-22.
Figure 24:
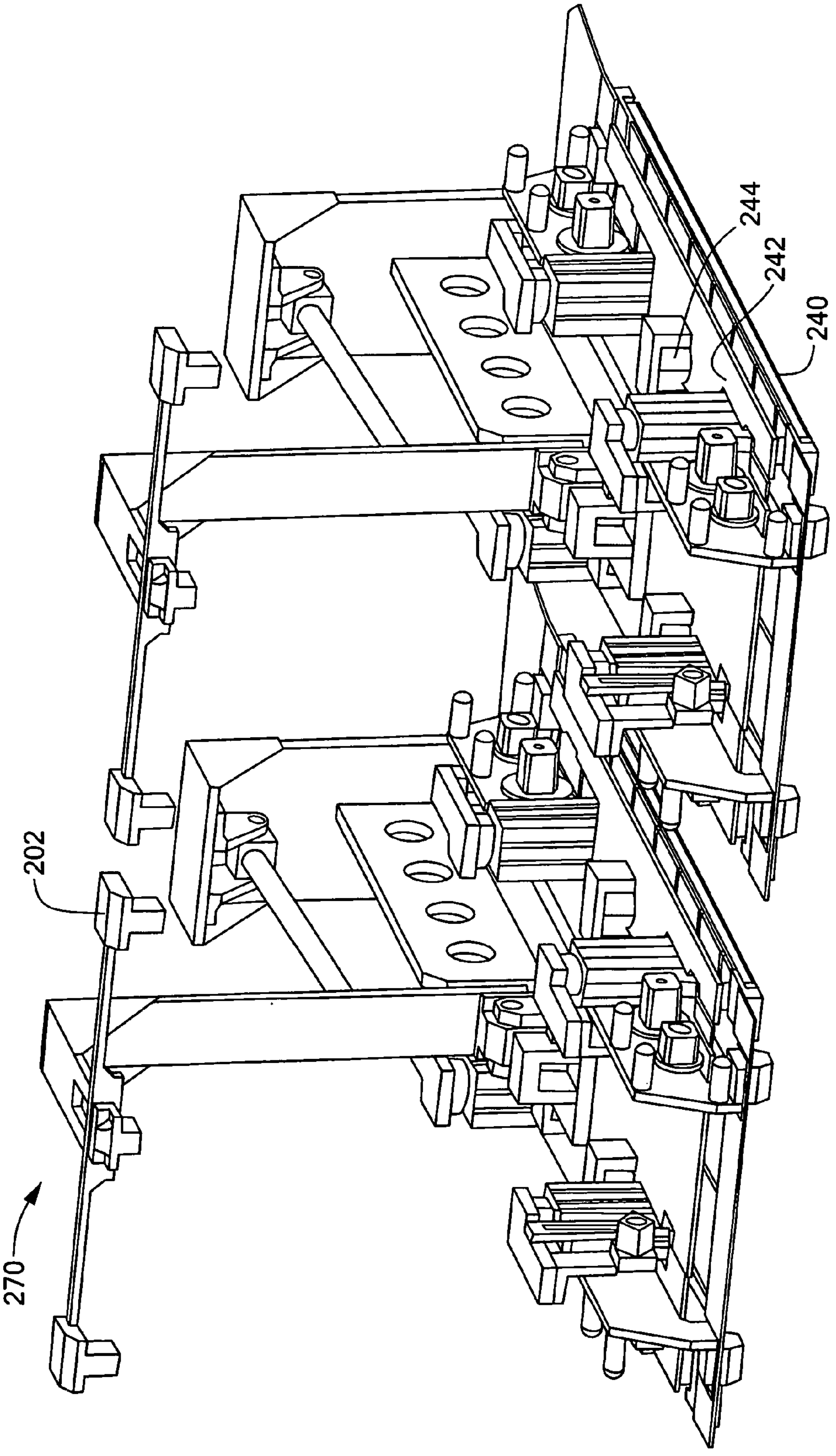

FIGS. 17-19 show mounts 260 connected to a belt driven robotic subsystem wherein belt 282 raises and lowers the handlers and belt 284 moves them right and left in the figure. FIGS. 19-20 shows substrates 12 in trays 90 in loading area 16, FIG. 1 after being manually loaded at in-feed section 13. FIGS. 21-22 show subsystem 270 in position to remove the slip sheets and the inboard side of bar 280 which includes the magnets and nozzle 202. There is also another air nozzle at the other end of bar 280 and also an air nozzle between the magnets. FIGS. 23-26 provide additional views.

Controller 21, FIG. 1 is programmed as follows in the preferred embodiment. After the unexposed flexographic plates are removed from their packaging and loaded into the trays in in-feed section 13, the trays are placed onto shelves and slid onto locating pins. Control system 21 then selects a shelf with the media and moves it into lowered position in loading area 16. Controller 21 moves all other shelves to the storage position. Air cylinders 244, FIG. 14 are actuated to move magnetic chuck 242 away from air chuck 240. Sensors (not shown) check for slip sheet presence and if a slip sheet is detected, tape dispenser mechanisms 277 are activated. If no slip sheet is detected, tape dispenser mechanisms 277 are not activated and the system proceeds to the next step in the cycle. Slip sheet removal subsystem 270 is then brought down into the position 276 shown in FIG. 15 and the slip sheet blow off nozzles begin to blow in a pulsating pattern. The whole handler then moves up a fixed distance from the top plate and, while the system is moving up and for a fixed time and while it is in the up position, the blow off nozzles of slip sheet removal subsystem 270 are pulsed on and off until the slip sheet is blown off the plate and into a paper disposal area behind in-feed section 13, FIG. 1. As sensors detect that the slip sheet has been removed, air cylinders 244, FIG. 14 are depressurized allowing magnetic chuck 244 to move closer to air chuck 240. The air supply to air chuck 240 is then turned on and the handlers are moved down to pick up the top plate on the media stack. The whole handler then moves up a fixed distance from the top plate and, while the system is moving up and for a fixed time and while it is in the up position, the blow off nozzles of the slip sheet removal subsystem 270 are pulsed on and off to ensure the next slip sheet in the stack is blown off the bottom of the plate and into a paper disposal area behind in-feed section 13, FIG. 1. The handler heads are then brought up to the travel position and the robot traverses from plate loading area 16, FIG. 1 to a position over the platen of imaging module 18. The robot lowers until air chuck 240, FIG. 15 is approximately ½ inch from the surface of the platen. Air cylinders 244 are again actuated to raise magnetic chuck 242 to the release position thus releasing the printing plates. Then, air cylinders in the platen actuate pusher pins and push the printing plates against the platen banking pins. The imaging head of the imager then exposes the plates and the platen moves out to the out-feed position of imaging module 18, FIG. 1.

Figure 25:
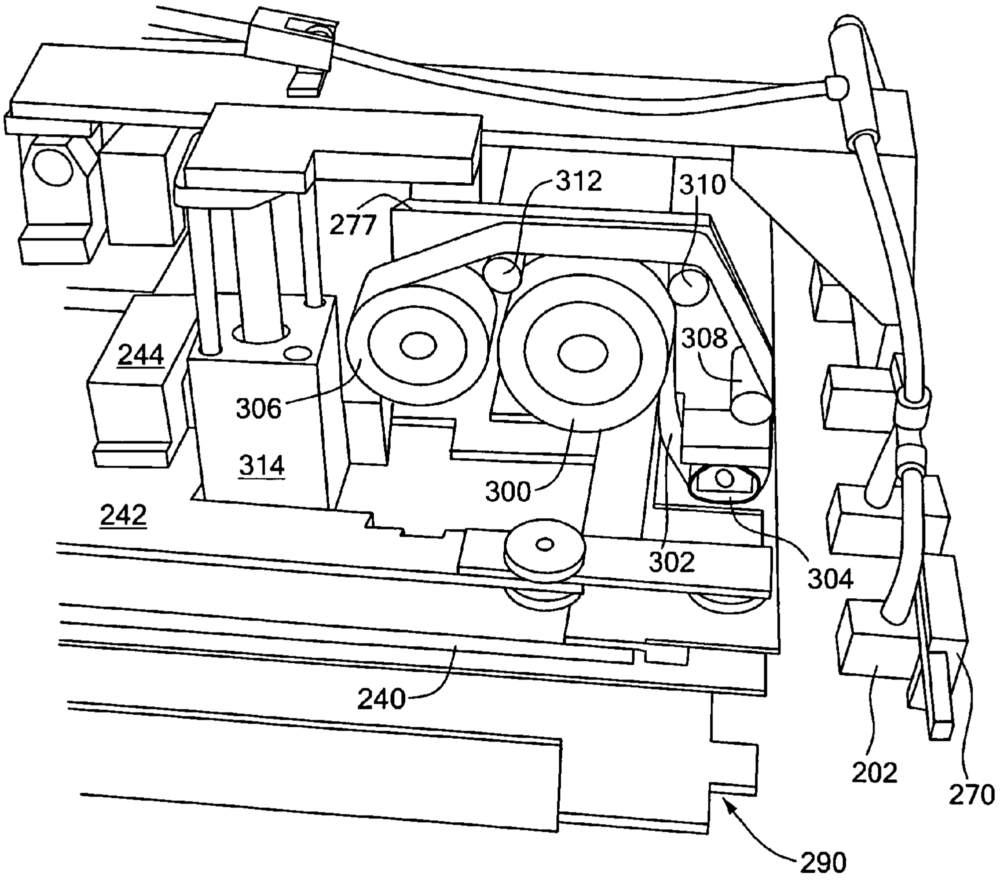
Figure 26:
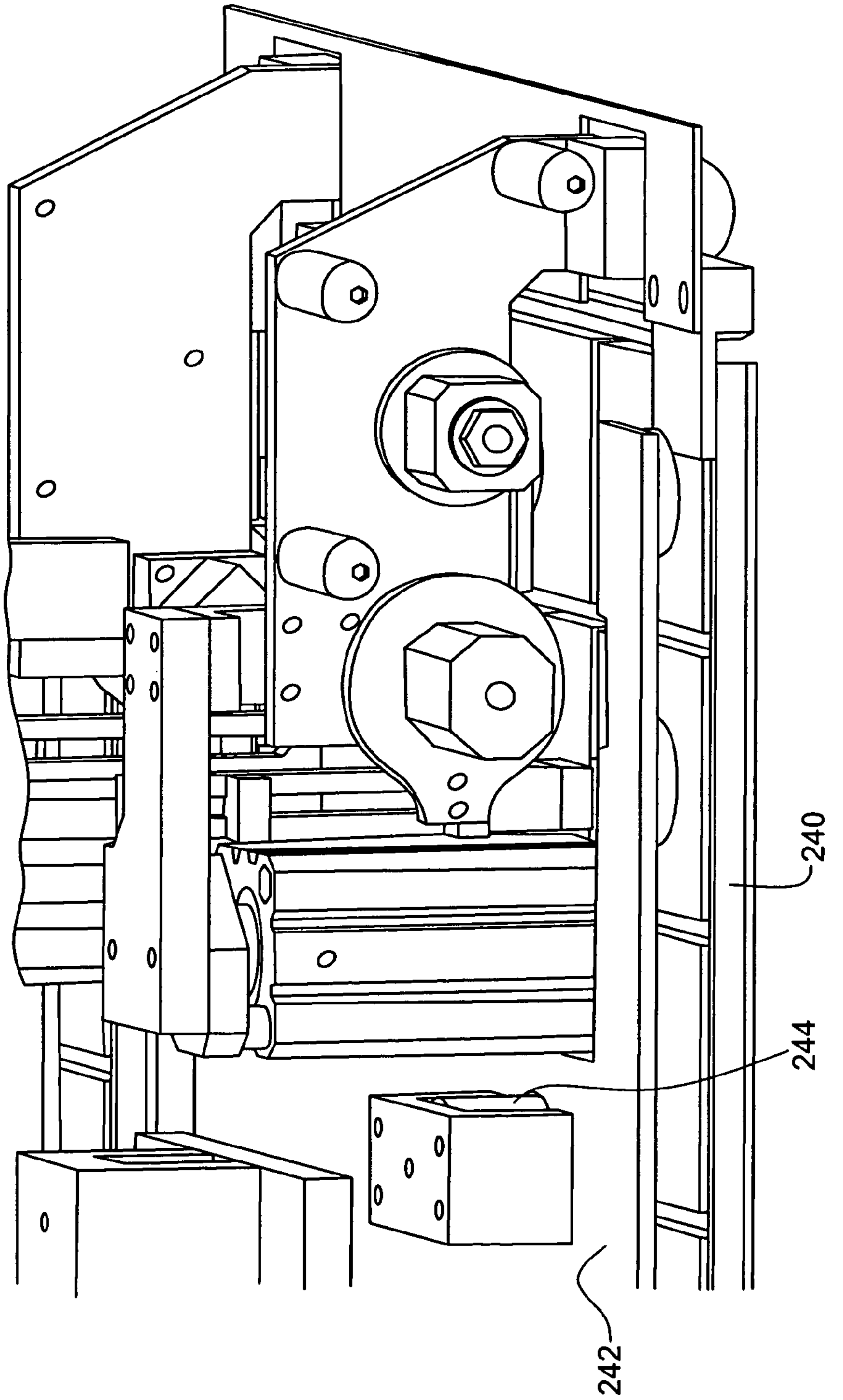

In the preferred embodiment, tape dispenser mechanism 277, FIG. 25, as discussed above, assists in separating a slip sheet from a plate. Supply roll 300 feeds tape 302 over conformal foot 304 to take-up reel 306 via rollers 308, 310, and 312. Air cylinder 314 moves tape mechanism 277 up and down. In the down position, tape 302 beneath foot 304 contacts the slip sheet to separate it from the photopolymer coating of the plate.

Therefore, specific features of the invention are shown in some drawings and not in others but this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. As explained above, other embodiments will occur to those skilled in the art and are within the following claims:

What is claimed is:

1. A substrate handling system comprising:

a gas chuck for producing a film of gas between a substrate and the gas chuck thereby preventing marring of the substrate such that the substrate is in non-contact state; and a magnetic chuck configured to alternately attract the substrate to the film of gas and to release the substrate;

wherein the gas chuck is moveably mounted with respect to the magnetic chuck.

2. The system of claim 1 in which the magnetic chuck is movable closer to the gas chuck to attract the substrate and in which the magnetic chuck is movable away from the gas chuck to release the substrate.

3. The system of claim 2 further including an actuator subsystem for moving the magnetic chuck away from and closer to the gas chuck.

4. The system of claim 3 in which the actuator subsystem includes at least one gas cylinder attached to the magnetic chuck and having a piston contacting the gas chuck for moving the magnetic chuck away from the gas chuck.

5. The system of claim 4 in which the actuator subsystem further includes a spring for biasing the magnetic chuck closer to the gas chuck.

6. The system of claim 2 in which the gas chuck includes a first large area plate with an array of gas orifices therein and the magnetic chuck includes a second large area plate with an array of magnets attached thereto.

7. The system of claim 6 further including a robot interface mount attached to the first large area plate for maneuvering the handling system to transfer the substrate from a feed station to an imaging station.

8. The system of claim 7 in which there are two side-by-side handling systems for transferring two smaller substrates at a time or one large substrate from the feed station to the imaging station.

9. The system of claim 1, wherein the magnetic chuck is mounted to the gas chuck on an opposite side of the gas chuck from the film of gas produced by the gas chuck.

10. The system of claim 1 in which the gas chuck is attached to the mounting plate and the magnetic chuck is attached to the mounting plate in a movable fashion closer to and away from the gas chuck.

11. The system of claim 10 further including a gimbal assembly between the gas chuck and the mounting plate.

12. The system of claim 10 in which the gas chuck includes the small area plate with the plurality of orifices therein.

13. The system of claim 12 in which the magnetic chuck includes a magnet and an actuator subsystem for moving the magnet closer to and away from the gas chuck.

14. The system of claim 13 in which the actuator subsystem includes a gas cylinder connected to the mounting plate and a piston interconnected to the magnet for urging the magnet alternately closer to and away from the substrate.

15. The system of claim 13 in which there are a plurality of gas chucks in a line attached to the mounting plate and a plurality of corresponding magnets each connected via a bar to a cross member driven by the actuator subsystem.

16. The system of claim 15 further including a robotic arm connected to the mounting plate for translating the mounting plate.

17. The system of claim 16 further including an actuator between the robotic arm and the mounting plate for raising and lowering the mounting plate.

18. The system of claim 1 further including a slip sheet removal subsystem for separating a slip sheet from the substrate.

19. The system of claim 18 in which the slip sheet removal subsystem includes at lease one magnet for attracting the substrate as the slip sheet is removed.

20. The system of claim 18 in which the slip sheet removal subsystem includes at least one tape mechanism.

21. The system of claim 20 in which the tape mechanism includes a feed roll, a take up roll, and a foot over which tape from the feed roll passes before being wound on the take up roll.

22. A substrate handling system comprising:

an air chuck for producing a film of air between a substrate and the air chuck;

a magnetic chuck for attracting the substrate to the air chuck; and an actuator subsystem for moving the magnetic chuck closer to and away from the air chuck to alternately pick up the substrate and release the substrate.

23. The system of claim 22 in which the air chuck includes a plurality of discrete members with air orifices therein and the magnetic chuck includes a plurality of corresponding magnets.

24. The system of claim 22, wherein the magnetic chuck is mounted to the gas chuck on an opposite side of the gas chuck from the film of gas produced by the gas chuck.

25. A substrate handling system comprising:

a first large area plate with an array of gas orifices therein for producing a film of air between a substrate and the plate;

a second large area plate with an array of magnets attached thereto moveably mounted with respect to the first large area plate; and an actuator subsystem for moving the second large area plate closer to and away from the first large area plate to alternately pick up and release the substrate.

26. The system of claim 25, wherein the second large plate area is mounted to the first large plate area on an opposite side of the first large plate area from the film of air produced by the first large plate area.

27. The system of claim 25 in which the magnets are each connected via a bar to a cross member which is raised and lowered with respect to the mounting plate by the actuator subsystem.

* * * * *

UNITED STATES PATENT AND TRADEMARK OFFICE

CERTIFICATE OF CORRECTION

PATENT NO. : 7,371,287 B2
APPLICATION NO. : 10/837842
DATED : May 13, 2008
INVENTOR(S) : Norman L. Shaver et al.

It is certified that error appears in the above-identified patent and that said Letters Patent is hereby corrected as shown below:

Column 12

Line 48, after “air chuck” add --such that the substrate is in non-contact state--

Column 12

Line 64, after “plate” add --such that the substrate is in non-contact state--

Signed and Sealed this

Nineteenth Day of August, 2008

JON W. DUDAS
*Director of the United States Patent and Trademark Office*